(12) United States Patent  (10) Patent No.: US 9,231,029 B2
Murooka  (45) Date of Patent: Jan. 5, 2016

(54) SEMICONDUCTOR MEMORY DEVICE AND METHOD FOR MANUFACTURING SAME

(71) Applicant: Kabushiki Kaisha Toshiba, Minato-ku (JP)

(72) Inventor: Kenichi Murooka, San Jose, CA (US)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/284,516

(22) Filed: May 22, 2014

(65) Prior Publication Data

US 2015/0171144 A1    Jun. 18, 2015

Related U.S. Application Data

(60) Provisional application No. 61/917,595, filed on Dec. 18, 2013.

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01); *H01L 45/16* (2013.01)

(58) Field of Classification Search
None
See application file for complete search history.

(56) References Cited

U.S. PATENT DOCUMENTS

| | | | |
|---|---|---|---|
| 8,124,968 B2 | 2/2012 | Koo et al. | |
| 8,295,077 B2 | 10/2012 | Murooka | |
| 2011/0292715 A1 | 12/2011 | Ishihara et al. | |
| 2012/0147644 A1 | 6/2012 | Scheuerlein | |
| 2012/0147645 A1 | 6/2012 | Scheuerlein | |
| 2012/0147646 A1 | 6/2012 | Scheuerlein | |
| 2012/0147647 A1 | 6/2012 | Scheuerlein | |
| 2012/0147648 A1* | 6/2012 | Scheuerlein | 365/51 |
| 2012/0147649 A1 | 6/2012 | Samachisa et al. | |
| 2012/0147650 A1 | 6/2012 | Samachisa et al. | |
| 2012/0147651 A1 | 6/2012 | Scheuerlein et al. | |
| 2012/0147652 A1 | 6/2012 | Scheuerlein | |
| 2012/0147689 A1 | 6/2012 | Scheuerlein et al. | |
| 2013/0148400 A1 | 6/2013 | Murooka | |
| 2013/0187118 A1 | 7/2013 | Murooka | |
| 2013/0215684 A1* | 8/2013 | Oh et al. | 365/185.29 |

FOREIGN PATENT DOCUMENTS

JP    2010-9669    1/2010

OTHER PUBLICATIONS

U.S. Appl. No. 14/593,254, filed Jan. 9, 2015, Murooka.
U.S. Appl. No. 14/593,344, filed Jan. 9, 2015, Murooka.
U.S. Appl. No. 14/017,727, filed Sep. 4, 2013, Murooka.
U.S. Appl. No. 14/017,703, filed Sep. 4, 2013, Murooka.
U.S. Appl. No. 14/025,146, filed Sep. 12, 2013, Murooka.
U.S. Appl. No. 14/156,595, filed Jan. 16, 2014, Murooka.
U.S. Appl. No. 14/022,443, filed Sep. 10, 2013, Yasutake, et al.

* cited by examiner

*Primary Examiner* — Khaja Ahmad
(74) *Attorney, Agent, or Firm* — Oblon, McClelland, Maier & Neustadt, L.L.P.

(57) ABSTRACT

According to one embodiment, a semiconductor memory device includes a plurality of global bit lines, a plurality of word lines, a plurality of bit lines, a plurality of resistance change films, a plurality of semiconductor layers, a gate insulating film, and a plurality of gate electrodes. Spacing in the first direction between the plurality of semiconductor layers is larger than spacing in the second direction between the plurality of semiconductor layers. The plurality of gate electrodes is separated in the first direction.

15 Claims, 30 Drawing Sheets

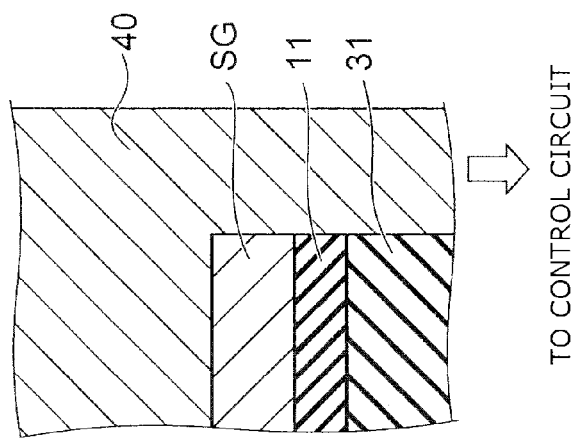
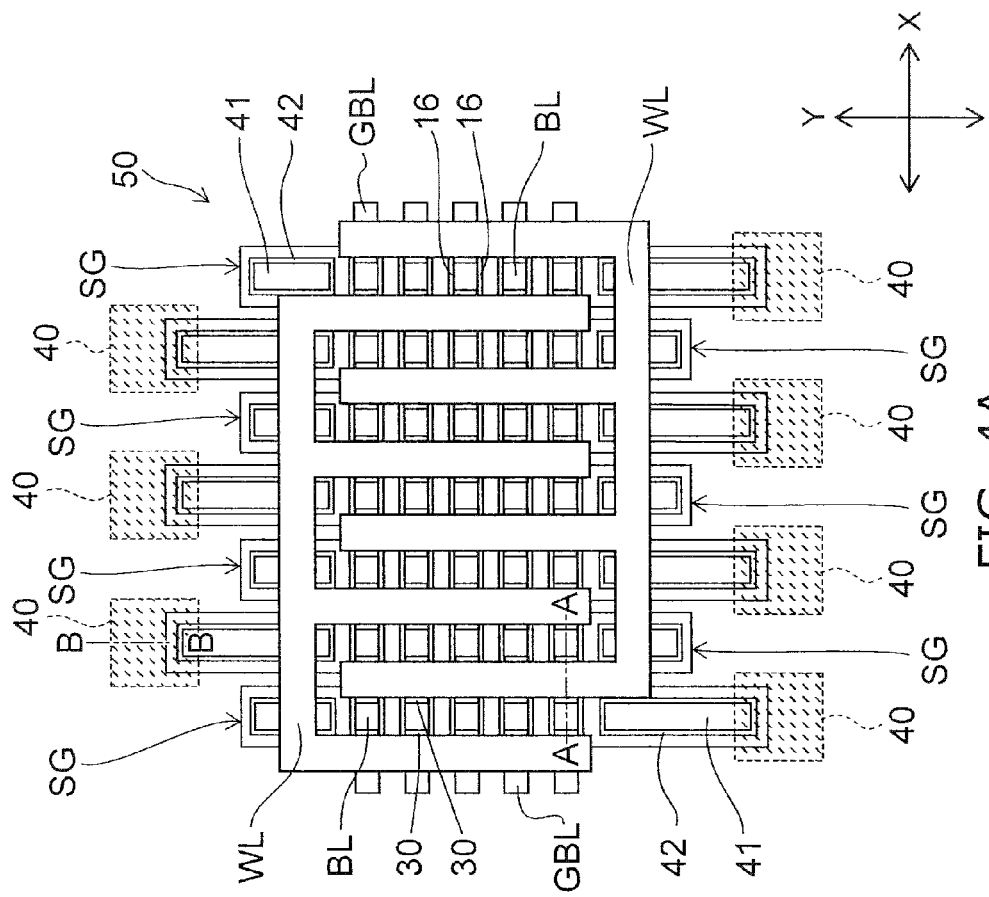

SEMICONDUCTOR MEMORY DEVICE AND METHOD FOR MANUFACTURING SAME

CROSS-REFERENCE TO RELATED APPLICATION

This application is based upon and claims the benefit of priority from U.S. Provisional Patent Application 61/917,595, filed on Dec. 18, 2013; the entire contents of which are incorporated herein by reference.

FIELD

Embodiments described herein relate generally to a semiconductor memory device and a method for manufacturing the same.

BACKGROUND

A resistance change memory with memory cells made of a resistance change material has been proposed in these years. The resistance change memory can be configured without using MOSFET (metal-oxide-semiconductor field effect transistors) for memory cells. Thus, the resistance change memory is expected to be able to enhance integration beyond the conventional trend. Furthermore, the resistance change memory has a configuration facilitating three-dimensional stacking. Thus, the resistance change memory can be expected to achieve a higher degree of integration than conventional memories using the two-dimensional plane alone.

However, three-dimensional stacking needs a technique for ensuring the power of driving a selected cell using a small size switching element.

BRIEF DESCRIPTION OF THE DRAWINGS

FIG. 4A is a schematic plan view of an example of the semiconductor memory device of the embodiment, FIG. 4B is a sectional view taken along line B-B in FIG. 4A;

DETAILED DESCRIPTION

Figure 1:
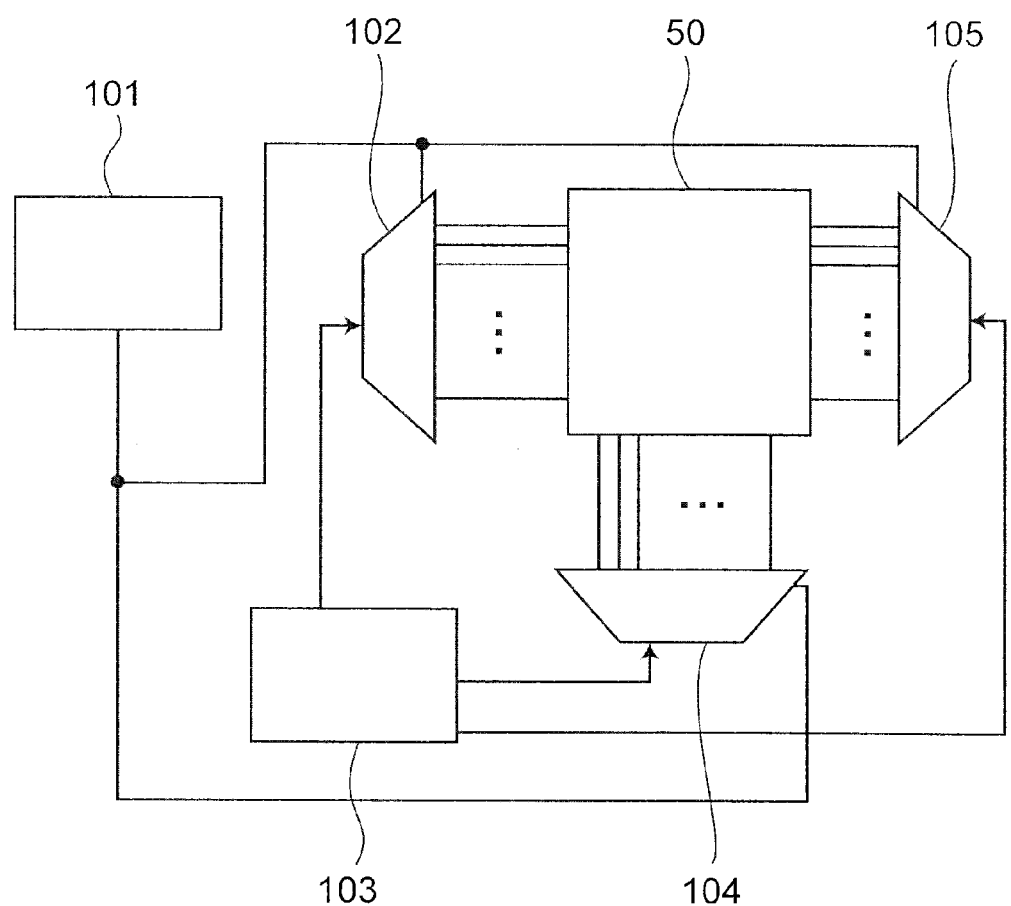
FIG. 1 is a block diagram showing an example of a semiconductor memory device of an embodiment.

According to one embodiment, a semiconductor memory device includes a plurality of global bit lines, a plurality of word lines, a plurality of bit lines, a plurality of resistance change films, a plurality of semiconductor layers, a gate insulating film, and a plurality of gate electrodes. The plurality of global bit lines extends in a first direction and is arranged with spacings in a second direction crossing the first direction. The plurality of word lines is spaced in the first direction. The plurality of word lines extends in the second direction. The plurality of word lines is stacked via an interlayer insulating layer in a third direction crossing the first direction and the second direction. The plurality of bit lines is arranged with spacings in the second direction between the word lines adjacent in the first direction. The plurality of bit lines extends in the third direction. The plurality of resistance change films is provided between the word lines and the bit lines. The plurality of semiconductor layers is provided between the global bit lines and the bit lines. The gate insulating film is provided on a side surface of the semiconductor layers. The plurality of gate electrodes is provided via the gate insulating film between the semiconductor layers in the second direction and on the side surface of the semiconductor layers in the first direction. The plurality of gate electrodes extends in the second direction. Spacing in the first direction between the plurality of semiconductor layers is larger than spacing in the second direction between the plurality of semiconductor layers. The plurality of gate electrodes is separated in the first direction.

Embodiments will now be described with reference to the drawings. In the drawings, like elements are labeled with like reference numerals.

FIG. 1 is a block diagram showing an example of a semiconductor memory device of an embodiment.

The semiconductor memory device of the embodiment includes a memory cell array 50. As described later with reference to FIGS. 3, 4A and the like, the memory cell array 50 includes a plurality of global bit lines GBL, a plurality of word lines WL, a plurality of bit lines (or local bit lines) BL, a plurality of resistance change films 30 provided between the word line WL and the bit line BL, and a plurality of gate electrodes (or select gates) SG.

Furthermore, the semiconductor memory device of the embodiment includes a control circuit including an upper-level block 103, a WL decoder 102, a GBL decoder 104, a selector decoder 105 and the like.

The WL decoder 102 is connected to each word line WL of the memory cell array 50. The GBL decoder 104 including a driver having the function of reading, writing, and erasing data is connected to each global bit line GBL. The selector decoder 105 is connected to each gate electrode SG.

The WL decoder 102 selects a word line WL connected to the cell to be written or erased in the memory cell array 50 based on address information from the upper-level block 103. The GBL decoder 104 selects a global bit line GBL connected to the cell to be written or erased in the memory cell array 50 based on address information from the upper-level block 103. The selector decoder 105 selects a gate electrode SG connected to the cell to be written or erased in the memory cell array 50 based on address information from the upper-level block 103.

A power supply 101 generates a combination of prescribed voltages corresponding to each operation of reading, writing, and erasing. The power supply 101 supplies the WL decoder 102 with a bias voltage for the selected word line WL and a bias voltage for the non-selected word line WL. The power supply 101 supplies the GBL decoder 104 with a bias voltage for the selected global bit line GBL and a bias voltage for the non-selected global bit line GBL. The power supply 101 supplies the selector decoder 105 with a select gate voltage. This enables reading, writing, and erasing of data in a prescribed memory cell of the memory cell array 50.

Figure 2:
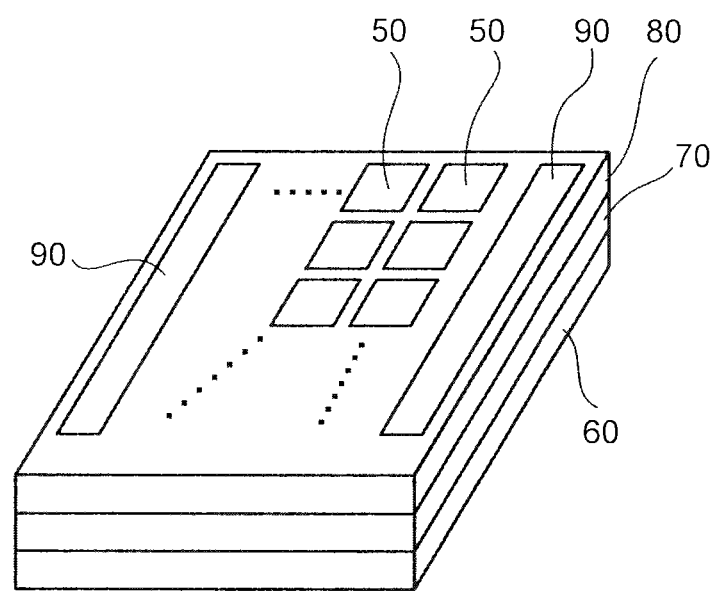
FIG. 2 is a schematic perspective view showing an example of the semiconductor memory device of the embodiment.

FIG. 2 is a schematic perspective view showing an example of the semiconductor memory device of the embodiment.

The memory cell array 50 and the control circuit for controlling the memory cell array 50 are integrally formed into a single chip on a common substrate 60.

The substrate 60 is e.g. a silicon substrate. A wiring layer and a circuit layer 70 including the control circuit (or peripheral circuit) such as the upper-level block 103, the WL decoder 102, the GBL decoder 104, and the selector decoder 105 described above are formed on the substrate 60. The control circuit includes e.g. CMOS (complementary metal-oxide-semiconductor) elements.

A memory layer 80 including the memory cell array 50 is formed on the circuit layer 70. A plurality of memory cell arrays 50 are formed in the memory layer 80.

An electrical connection section connected to the control circuit is formed around each memory cell array 50. A plurality of blocks each including the memory cell array 50 and the connection section therearound are arranged in a matrix in the memory layer 80.

The wiring of the control circuit is formed with a looser design rule than the wiring of the memory cell array 50 except the connection section connected to the memory cell array 50.

An input/output section 90 of the device including terminals connected to the input/output section of the control circuit via through holes is formed in the end region of the memory layer 80. This input/output section 90 is bonded to a lead frame in the packaging step.

By stacking the memory layer 80 on the circuit layer 70, the insulating film formed on the memory cell array 50 can also work as a film serving as a protective film of the control circuit. Furthermore, the memory cell array 50 and the control circuit are electrically coupled in the direction perpendicular to the major surface of the substrate 60. This enables reduction in operation time and significant increase in the number of simultaneously readable/writable cells without increasing the chip area.

Next, the memory cell array 50 is described in detail.

Figure 3:
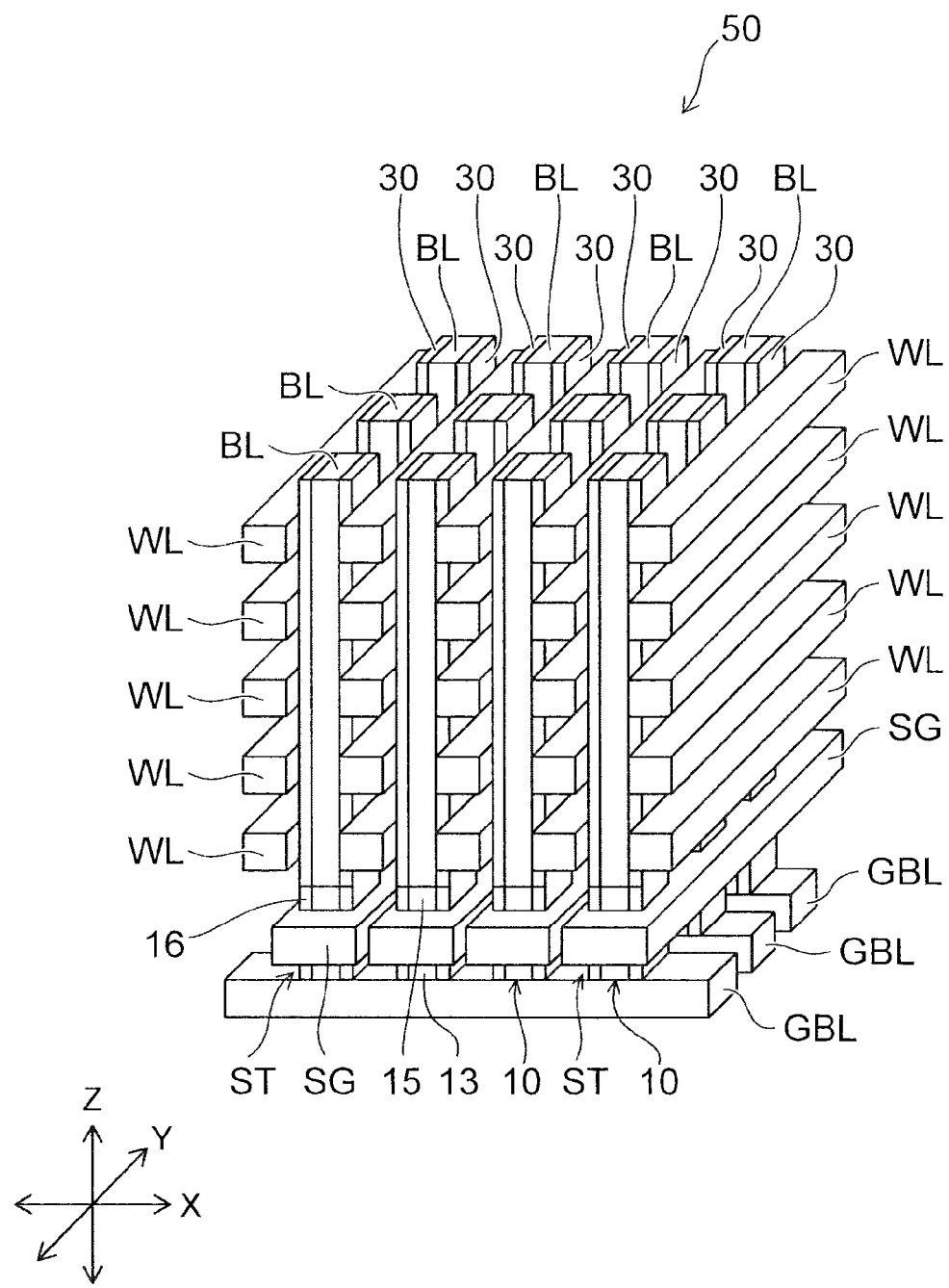
FIG. 3 is a schematic perspective view of an example showing an example of a memory cell array of the semiconductor memory device of the embodiment.

FIG. 3 is a schematic perspective view showing an example of the memory cell array 50.

FIG. 4A is a schematic plan view of the memory cell array 50.

Figure 5:
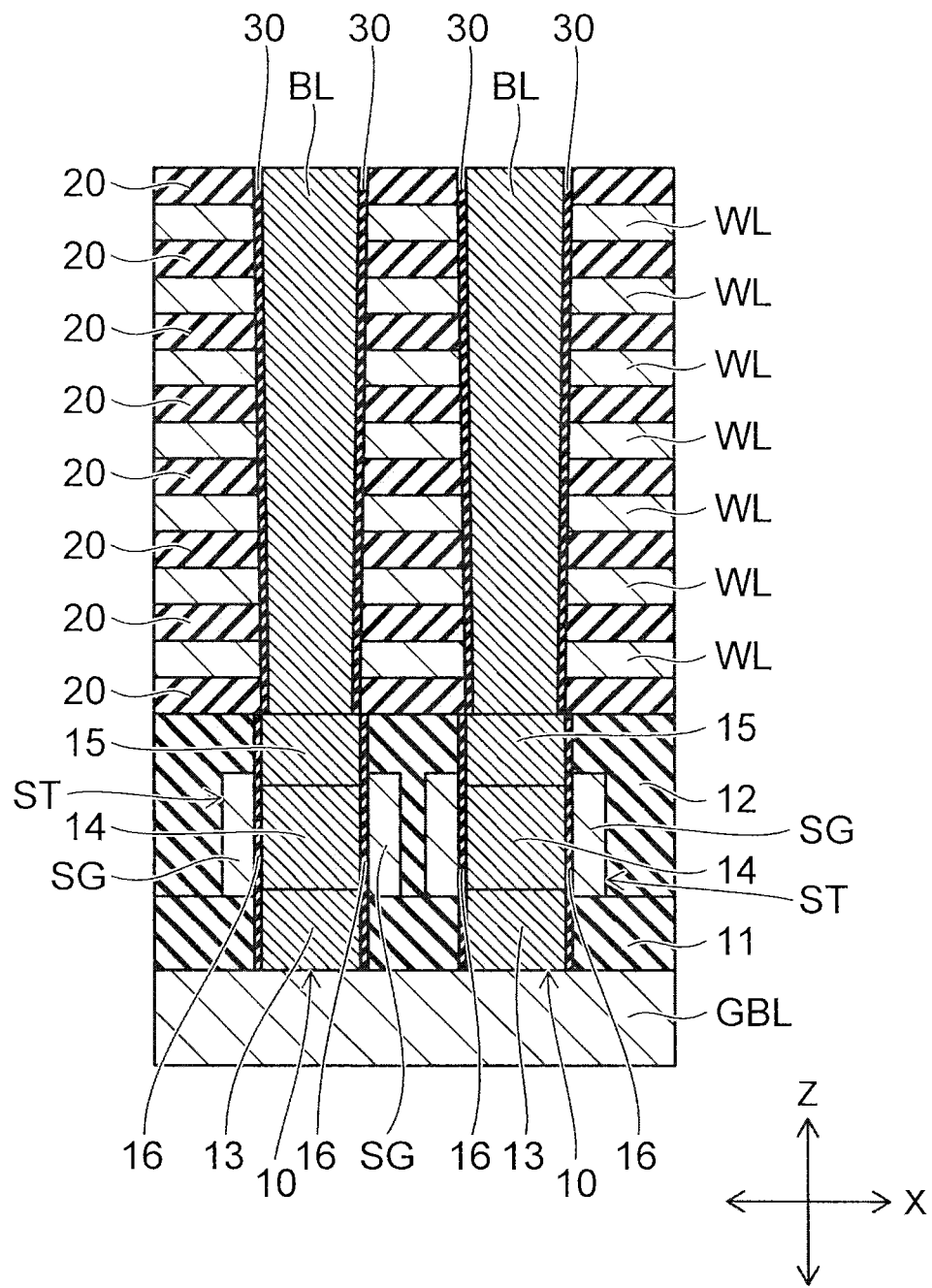
FIG. 5 is a sectional view taken along line A-A in FIG. 4A.

FIG. 5 is a sectional view taken along line A-A in FIG. 4A.

Figure 15:
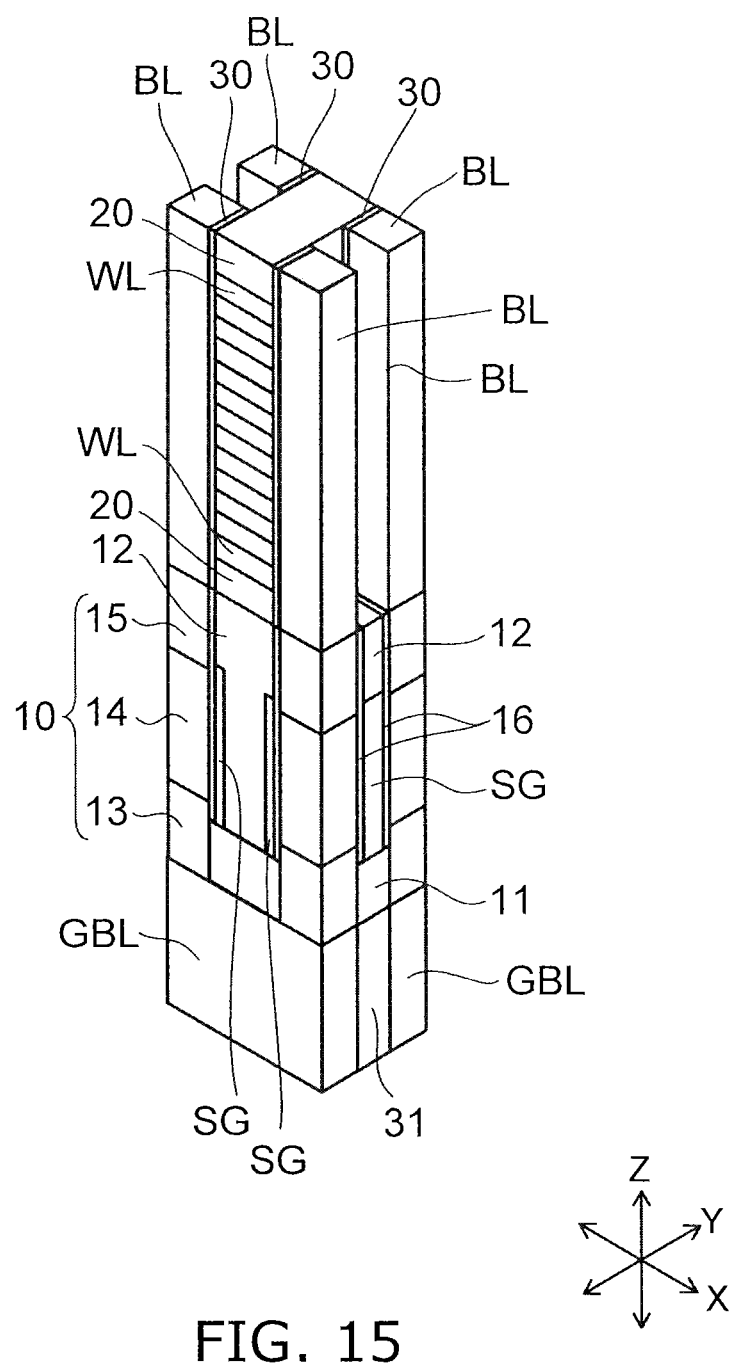

A plurality of global bit lines GBL are provided on an insulating layer provided on the circuit layer 70 or the memory layer 80 shown in FIG. 2 described above. The global bit line GBL extends in the X-direction (first direction). The plurality of global bit lines GBL are arranged with spacings in the Y-direction (second direction). The global bit line GBL is made of e.g. a metal material. An insulating film 31 shown in FIG. 15 is provided between the global bit lines GBL adjacent in the Y-direction.

The X-direction and the Y-direction are orthogonal in the plane parallel to the major surface of the substrate 60. The Z-direction (third direction) is defined as the direction perpendicular to the major surface of the substrate 60 and orthogonal to the X-direction and the Y-direction.

As shown in FIG. 5, an insulating layer 11 is provided on the global bit line GBL. The gate electrode SG of a select transistor (select element) ST is provided on the insulating layer 11.

As shown in FIGS. 3 and 4A, the gate electrode SG extends in the Y-direction. A plurality of gate electrodes SG are arranged with spacings in the X-direction.

A semiconductor layer 10 shaped like e.g. a column is provided on the global bit line GBL. Here, the shape of the column also includes a quadrangle with rounded corners, a circle, an ellipse and the like. A plurality of semiconductor layers 10 are arranged in a matrix in the X-direction and the Y-direction on the plurality of global bit lines GBL.

The semiconductor layer 10 includes a conductive layer 13, a channel layer 14, and a conductive layer 15. The conductive layer 13 is provided on the global bit line GBL in contact with the global bit line GBL. The channel layer 14 is provided on the conductive layer 13. The conductive layer 15 is provided on the channel layer 14.

The conductive layer 13, the channel layer 14, and the conductive layer 15 are formed from e.g. polycrystalline silicon containing dopant. The conductive layer 13 and the conductive layer 15 contain dopant with higher concentration than the channel layer 14.

A gate insulating film 16 is provided between the channel layer 14 and the gate electrode SG.

A select transistor ST including the semiconductor layer 10, the gate electrode SG, and the gate insulating film 16 is provided between the global bit line GBL and the bit line BL.

The select transistor ST is covered with an insulating layer 12. A stacked body described below is provided on the insulating layer 12.

As shown in FIG. 5, insulating layers 20 and word lines WL are alternately stacked on the insulating layer 12 in the Z-direction.

As shown in FIG. 3, a plurality of word lines WL extending in the Y-direction are arranged with spacings in the X-direction in one layer. An insulating layer 20 shown in FIG. 5 is provided between the word lines WL of different layers.

A bit line BL shaped like e.g. a column is provided on the semiconductor layer 10 of the select transistor ST. The lower end of the bit line BL is in contact with the conductive layer 15 in the semiconductor layer 10. A plurality of columnar bit lines BL are arranged in a matrix in the X-direction and the Y-direction.

A plurality of bit lines BL are arranged in the Y-direction between the word lines WL adjacent in the X-direction. An insulating film, not shown, is provided between the bit lines BL adjacent in the Y-direction.

A resistance change film 30 is provided between the bit line BL and the word line WL. The resistance change film 30 is provided on both side surfaces facing the X-direction of the bit line BL. The word lines WL adjacent in the X-direction sandwich a bit line BL via the resistance change films 30.

As shown in FIG. 4A, every other one in the X-direction of the plurality of word lines WL is connected to a common wiring. That is, every other word line in the X-direction of the plurality of word lines WL is supplied with the same voltage.

The select transistor ST is turned on by the potential applied to the gate electrode SG. Then, the bit line BL is electrically connected to the global bit line GBL. The select transistor ST selects a bit line BL to be selected from a plurality of bit lines BL.

The resistance change film 30 can be electrically switched between a state having a relatively low resistance (set state) and a state having a relatively high resistance (reset state). The resistance change film 30 stores data in a nonvolatile manner.

The resistance change film 30 in the high resistance state transitions to the low resistance state when a voltage higher than or equal to a certain voltage is applied thereto through the bit line BL and the word line WL. The resistance change film 30 in the low resistance state transitions to the high resistance state when a current higher than or equal to a certain current flows therein through the bit line BL and the word line WL.

The resistance change film 30 is made of metal oxide or the like. Specifically, the resistance change film 30 can be formed from a thin film including at least one material such as HfO, $TiO_2$, $ZnMn_2O_4$, NiO, $SrZrO_3$, $Pr_{0.7}Ca_{0.3}MnO_3$, and carbon.

Alternatively, the resistance change film 30 can be based on polycrystalline or amorphous Si, or Ge, SiGe, GaAs, InP, GaP, GaInAsP, GaN, SiC, SiO, SiON, SiN, HfSiO, AlO or the like. Alternatively, the resistance change film 30 can be a stacked film of the aforementioned material. An electrode made of e.g. Ag, Au, Ti, Ni, Co, Al, Fe, Cr, Cu, W, Hf, Ta, Pt, Ru, Zr, or Ir, or a nitride, carbide or the like thereof, can be placed between the resistance change film 30 and the bit line BL. Alternatively, the electrode can be based on a material in which the aforementioned material is added to polycrystalline silicon.

Figure 6A:
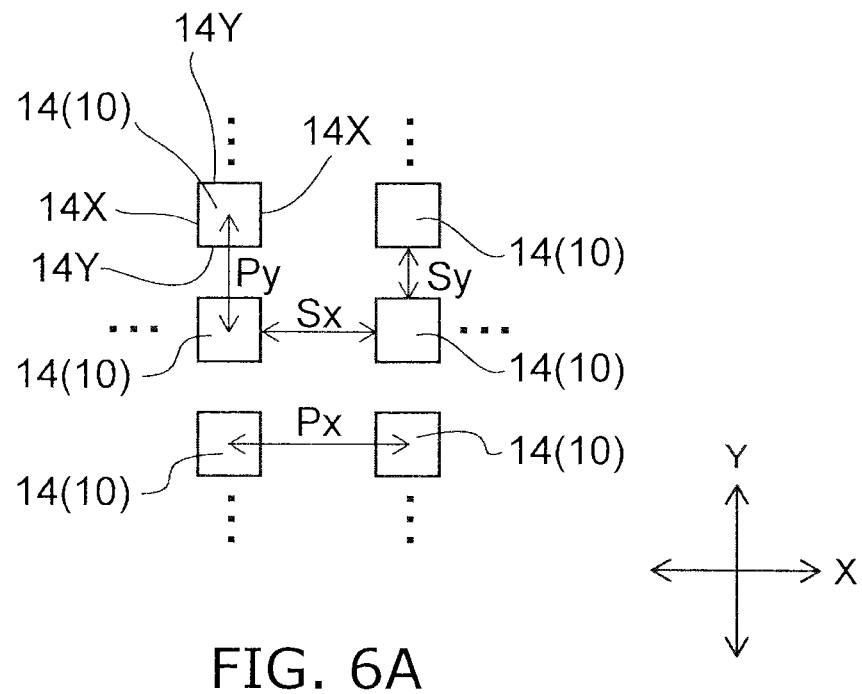
FIGS. 6A and 6B are schematic plan views of an example of a select transistor of the semiconductor memory device of the embodiment.
Figure 6B:
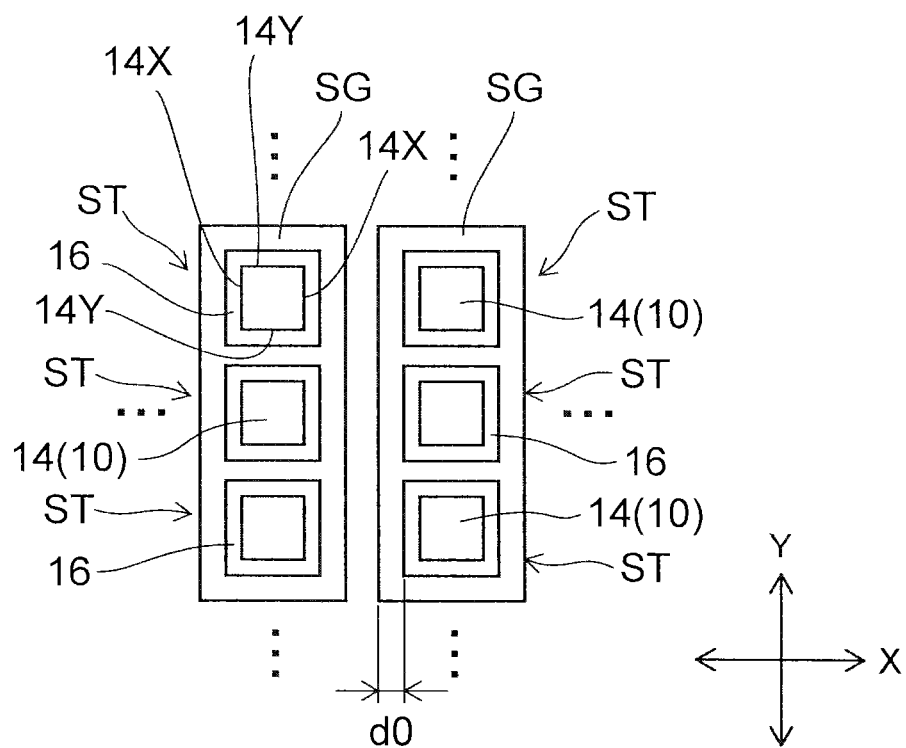

FIG. 6B is a schematic plan view of the select transistor ST.

The channel layer 14 is formed in e.g. a schematic planar shape. The gate insulating film 16 is provided on a first side surface 14X facing the X-direction and a second side surface 14Y facing the Y-direction of the channel layer 14. That is, the gate insulating film 16 covers all the side surfaces of the channel layer 14.

The gate electrode SG is opposed to the first side surface 14X and the second side surface 14Y of the channel layer 14 across the gate insulating film 16 and extends in the Y-direction. The gate electrode SG surrounds all the side surfaces of the channel layer 14 via the gate insulating film 16.

A plurality of gate electrodes SG are separated in the X-direction. The gate electrode SG is formed via the gate insulating film 16 between a plurality of channel layers 14 arranged in the Y-direction. As a result, the select transistors ST adjacent in the Y-direction share the gate electrode SG.

The spacing between the plurality of channel layers 14 arranged in a matrix in the X-direction and the Y-direction is appropriately configured. Thus, as described later, gate electrodes SG separated in the X-direction and connected in the Y-direction can be formed by the process of depositing a film nearly isotropically on the side surface of the channel layer 14 (hereinafter also referred to as "sidewall deposition process").

That is, as shown in FIG. 6A, the X-direction spacing Sx of the plurality of channel layers 14 is made larger than the Y-direction spacing Sy.

The spacing Sy between the gate insulating films 16 formed on the channel layers 14 adjacent in the Y-direction is narrower than twice the film thickness d0 of the gate electrode material film. Thus, the gate electrode material deposited on the second side surfaces 14Y of the channel layers 14 is connected in the Y-direction gap and fills the Y-direction gap. On the other hand, the spacing Sx between the gate insulating films 16 formed on the channel layers 14 adjacent in the X-direction is wider than twice the film thickness d0 of the gate electrode material film. Thus, the gate electrode material deposited on the first side surfaces 14X of the channel layers 14 does not fill the gap between the channel layers 14 adjacent in the X-direction. At the bottom of the X-direction gap, the gate electrode material is deposited so as to be connected in the X-direction. However, the gate electrode material at the bottom is removed by etch-back after film formation. Thus, the gate electrode SG is separated in the X-direction.

The X-direction pitch Px of the plurality of channel layers 14 may be made larger than the Y-direction pitch Py. This facilitates forming gate electrodes SG separated in the X-direction and connected in the Y-direction by the isotropic sidewall deposition process.

The select transistor ST uses a region having a very narrow width as a channel. This may make it difficult to ensure a current for writing or reading data in the memory cell.

Thus, according to the embodiment, the gate electrode SG is formed via the gate insulating film 16 on all the side surfaces (e.g., four side surfaces) rather than on only two side surfaces of the channel layer 14. Accordingly, all the side surfaces of the columnar channel layer 14 can be used as a channel. This can significantly increase the on-current of the select transistor ST.

That is, according to the embodiment, even in the case of using the three-dimensional stacked structure of memory cells, a simple cell decoding scheme can be realized. Furthermore, a large on-current can be obtained.

As shown in FIG. 4A, a contact 40 is provided at the Y-direction end of each gate electrode SG.

In the region between the adjacent memory cell arrays 50, the contact 40 is connected to the wiring of the control circuit formed in the circuit layer 70 shown in FIG. 2. That is, the gate electrode SG is electrically connected to the selector decoder 105 shown in FIG. 1 via the contact 40.

For instance, a conductive material is embedded in the contact hole extending from the end part of the gate electrode SG toward the underlying circuit layer 70. Thus, a contact 40 is formed.

The global bit line GBL is not provided below the end part of the gate electrode SG provided with the contact 40. Thus, the contact 40 extending downward from the end part of the gate electrode SG can be prevented from being connected to the global bit line GBL.

As shown in FIG. 4A, the contacts 40 provided on the gate electrodes SG adjacent in the X-direction are not placed on the end parts on the same side in the Y-direction, but placed on the end parts on opposite sides. That is, one of the gate electrodes SG adjacent in the X-direction is connected, in one Y-direction end part, to an element (such as a transistor) in the control circuit through the contact 40. The other gate electrode SG is connected, in the other Y-direction end part, to an element in the control circuit through the contact 40.

The end part of the gate electrode SG provided with the contact 40 is projected further in the Y-direction than the end part of the gate electrode SG not provided with the contact 40.

Thus, a plurality of contacts 40 are arranged in the X-direction with a spacing wider than or equal to the width of the gate electrode SG. Accordingly, even if the X-direction pitch between the gate electrodes SG becomes shorter, the distance between the contacts 40 adjacent in the X-direction can be separated.

FIG. 4B shows a cross section taken along line B-B in FIG. 4A. As shown in FIG. 4B, the contact 40 is in contact with the upper surface and the side surface of the gate electrode SG. The lower end of the contact 40 is connected to an element in the control circuit.

Next, a method for forming the memory cell array 50 of the embodiment is described.

FIGS. 7A to 15 are schematic perspective views showing an example of the method for forming the memory cell array 50. FIGS. 7A to 15 show the region in which four bit lines BL are arranged on two global bit lines GBL.

Figure 7A:
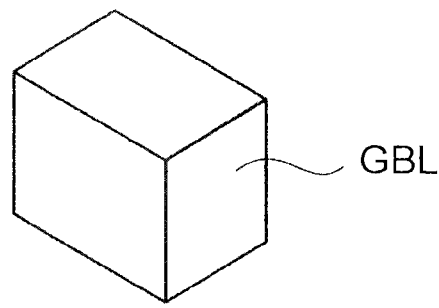
FIGS. 7A to 30B are schematic views of an example showing a method for manufacturing the semiconductor memory device of the embodiment.
Figure 7B:
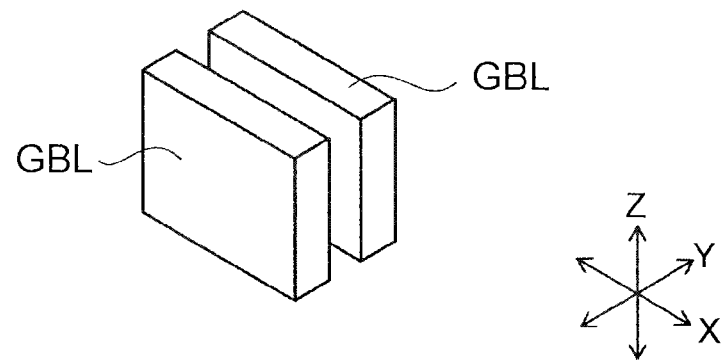

A circuit layer 70 is formed on the substrate 60 shown in FIG. 2. Furthermore, as shown in FIG. 7A, a metal material layer, for instance, constituting the material of the global bit line GBL is formed via an insulating layer, not shown. This metal material layer is processed by etching. Thus, global bit lines GBL having a line-and-space pattern extending in the X-direction and separated in the Y-direction are formed as shown in FIG. 7B. Each global bit line GBL extends in the X-direction.

Figure 7C:
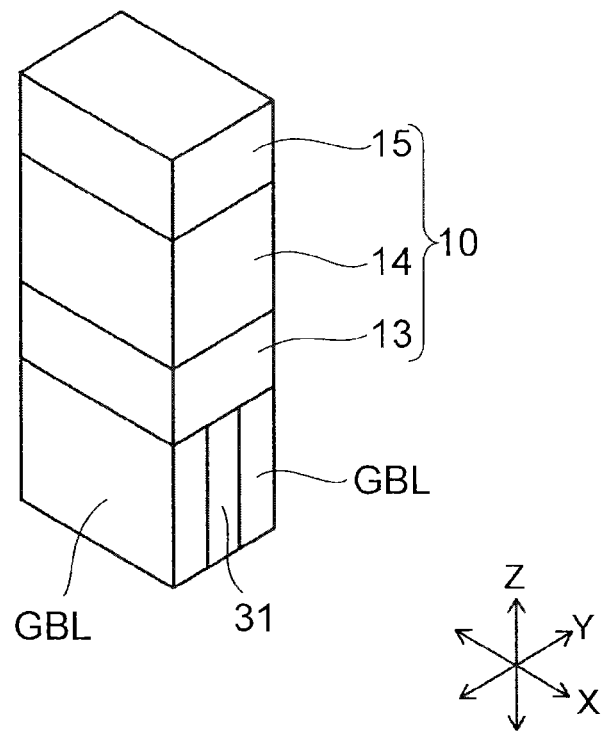

As shown in FIG. 7C, an insulating film 31 is embedded between the global bit lines GBL adjacent in the Y-direction.

Next, as shown in FIG. 7C, a semiconductor layer 10 including a conductive layer 13, a channel layer 14, and a conductive layer 15 is formed on the global bit lines GBL and the insulating film 31.

The conductive layer 13 and the conductive layer 15 are e.g. $N^+$-silicon layers containing N-type dopant. The N-type dopant concentration of the conductive layer 13 and the conductive layer 15 is e.g. $1 \times 10^{20}$ cm$^{-3}$.

The channel layer 14 is e.g. a P⁻-silicon layer containing P-type dopant. The P-type dopant concentration of the channel layer 14 is lower than the N-type dopant concentration of the conductive layer 13 and the conductive layer 15, and is e.g. $1 \times 10^{18}$ cm$^{-3}$.

Figure 8A:
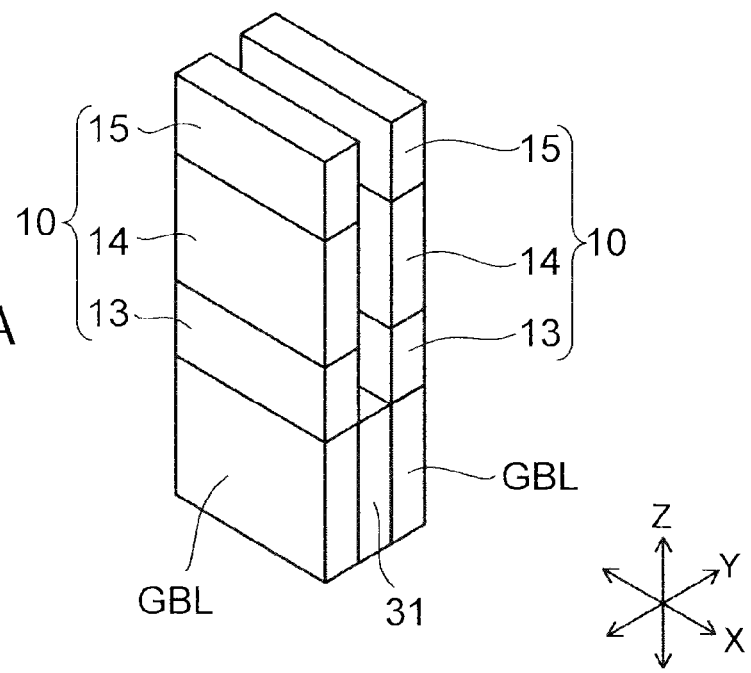
Figure 8B:
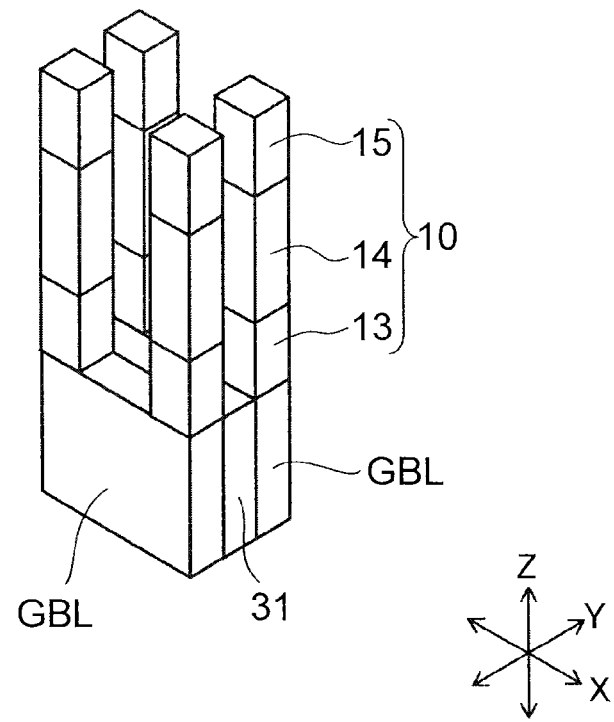

Next, as shown in FIG. 8A, the semiconductor layer 10 is processed in a line-and-space pattern extending in the X-direction and separated in the Y-direction by RIE (reactive ion etching) technique. Furthermore, as shown in FIG. 8B, the semiconductor layer 10 is separated also in the X-direction by RIE technique. Thus, a plurality of columnar semiconductor layers 10 are formed on the global bit line GBL.

At this time, as shown in FIG. 6A, the X-direction spacing Sx between the plurality of semiconductor layers 10 is made larger than the Y-direction spacing Sy. Furthermore, the X-direction pitch Px of the plurality of semiconductor layers 10 is made larger than the Y-direction pitch Py.

An insulating layer 11 is embedded in the gap between the plurality of semiconductor layers 10. The insulating layer 11 is etched back so that the upper surface of the insulating layer 11 is set back to a position on the conductive layer 13 side slightly from the boundary between the conductive layer 13 and the channel layer 14. The insulating layer 11 is e.g. a silicon oxide layer.

Next, a gate insulating film 16 is conformally formed at the bottom of the gap between the semiconductor layers 10 (the upper surface of the insulating layer 11) and on the side surface and the upper surface of the semiconductor layer 10. Subsequently, as shown in FIG. 9B, the gate insulating film 16 deposited at the bottom of the gap between the semiconductor layers 10 and on the upper surface of the semiconductor layer 10 is removed by etching. The gate insulating film 16 is formed on all the side surfaces of the semiconductor layer 10. The gate insulating film 16 is e.g. a silicon oxide film.

Next, a gate electrode material film is deposited by e.g. CVD (chemical vapor deposition) technique on the exposed portion in the structure of FIG. 9B. The gate electrode material film is e.g. a polycrystalline silicon film containing dopant.

At this time, the Y-direction spacing Sy between the plurality of semiconductor layers 10 is wider than twice the film thickness of the gate insulating film 16, and narrower than the sum of twice the film thickness of the gate insulating film 16 and twice the film thickness d0 of the gate electrode material film. As a result, as shown in FIG. 6B, the gate electrode material film deposited on the second side surfaces 14Y of the channel layers 14 (semiconductor layers 10) is connected in the Y-direction gap and fills the Y-direction gap.

On the other hand, the X-direction spacing Sx between the plurality of semiconductor layers 10 is wider than the sum of twice the film thickness of the gate insulating film 16 and twice the film thickness d0 of the gate electrode material film. Thus, the gate electrode material deposited on the first side surfaces 14X of the semiconductor layers 10 does not fill the gap between the semiconductor layers 10 adjacent in the X-direction. That is, a gap is left between the semiconductor layers 10 adjacent in the X-direction.

The X-direction pitch Px of the plurality of semiconductor layers 10 is made larger than the Y-direction pitch Py. This facilitates forming gate electrodes SG separated in the X-direction and connected in the Y-direction by the sidewall deposition process as described above.

Figure 10A:
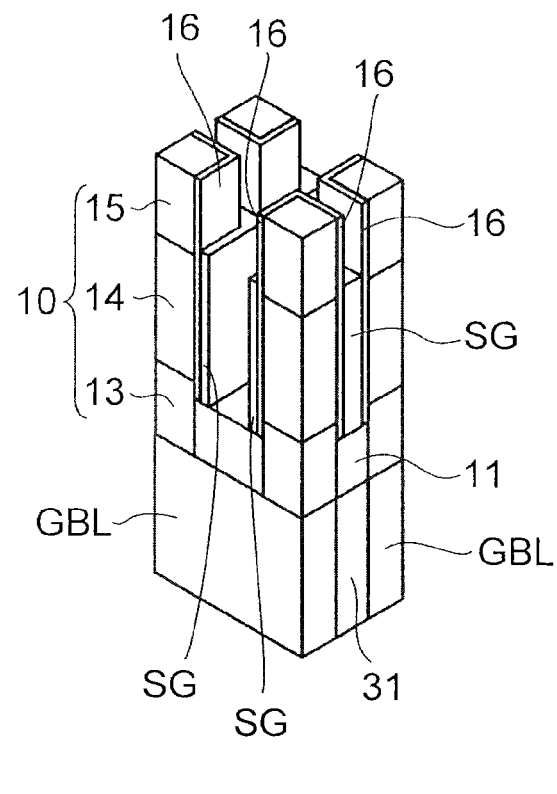

As shown in FIG. 10A, the gate electrode material film deposited at the bottom of the gap between the plurality of semiconductor layers 10 (the upper surface of the insulating layer 11) and on the upper surface of the semiconductor layer 10 is removed by etch-back. Furthermore, by this etch-back, the upper end of the gate electrode material film is set back to a position on the conductive layer 15 side slightly from the boundary between the channel layer 14 and the conductive layer 15.

The gate electrode material film is deposited at the bottom of the X-direction gap so as to be connected in the X-direction. However, the gate electrode material film formed in the X-direction gap with the Z-direction film thickness equal to d0 is removed by the aforementioned etch-back. Thus, the gate electrode SG is separated in the X-direction.

Thus, the gate electrode SG surrounds all the side surfaces of the semiconductor layer 10 shaped like e.g. a column via the gate insulating film 16. The gate electrode SG is connected in the Y-direction and separated in the X-direction.

Figure 10B:
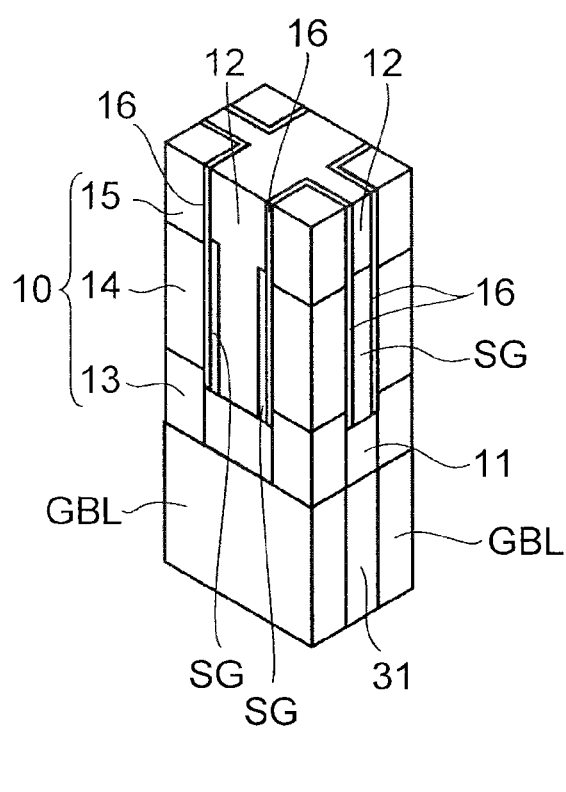

As shown in FIG. 10B, an insulating layer 12 is embedded in the gap between the gate electrodes SG separated in the X-direction and on the gate electrode SG. The insulating layer 12 is e.g. a silicon oxide layer.

The insulating layer 12 deposited on the semiconductor layer 10 is etched back and planarized.

Figure 11:
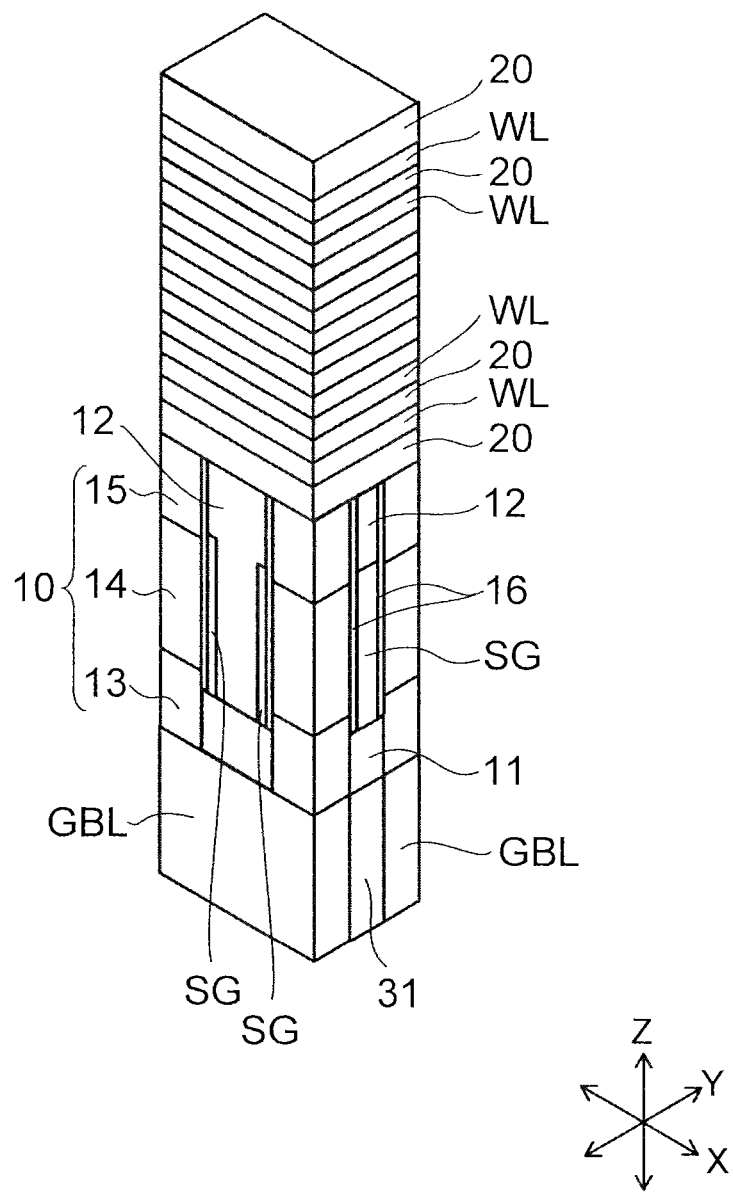

As shown in FIG. 11, a stacked body including a plurality of word lines WL and a plurality of insulating layers 20 is formed on the insulating layer 12 and the semiconductor layer 10.

For instance, the word line WL is a layer composed primarily of titanium nitride (TiN). The insulating layer 20 is a layer composed primarily of silicon oxide ($SiO_2$).

The insulating layers 20 and the word lines WL are alternately stacked. Here, the number of stacked word lines WL is not limited to the number shown in the figure. In the stacked body, the film thickness of the lowermost insulating layer 20 and the film thickness of the uppermost insulating layer 20 can be made thicker than the film thickness of the insulating layer 20 between the word lines WL.

Figure 12:
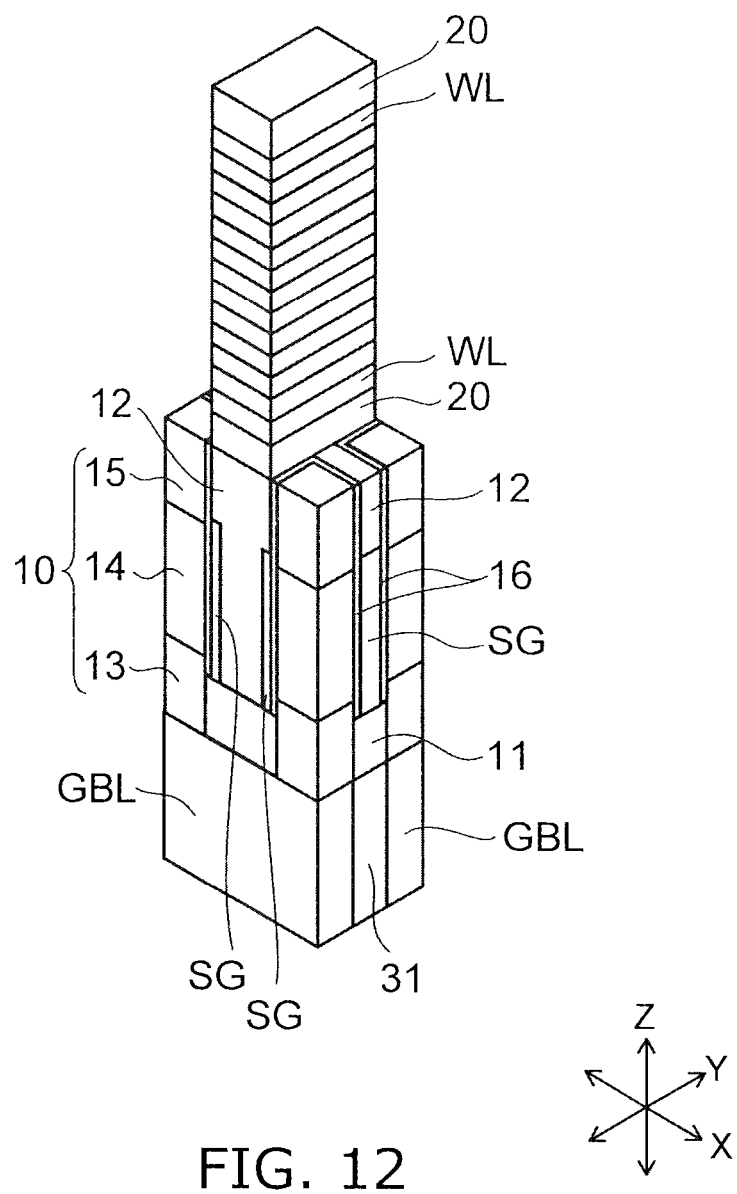

As shown in FIG. 12, the aforementioned stacked body is processed in a line-and-space pattern extending in the Y-direction and separated in the X-direction by RIE technique. The stacked body is left like a fin on the region between the semiconductor layers 10 adjacent in the X-direction (on the insulating layer 12).

Figure 13:
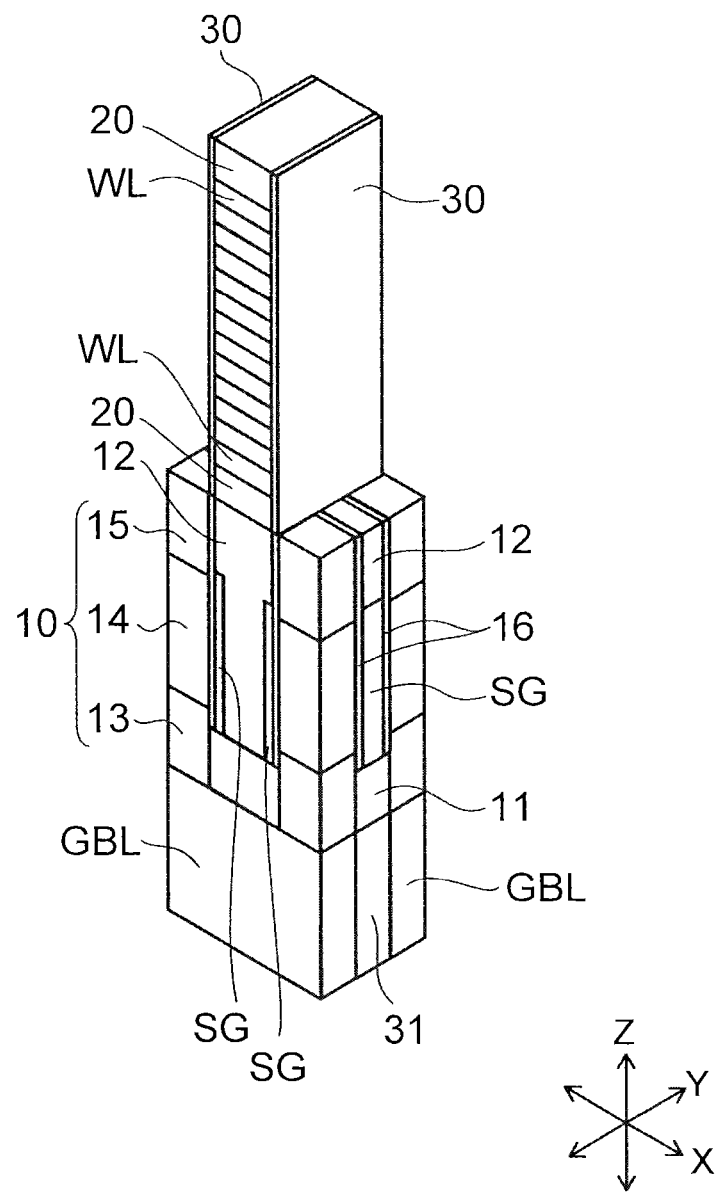

As shown in FIG. 13, a resistance change film 30 is formed on both side surfaces facing the X-direction of the stacked body including the word lines WL.

The resistance change film 30 is formed so as to conformally cover the fin-shaped stacked body. The resistance change film 30 deposited on the upper surface of the stacked body and the resistance change film 30 deposited at the bottom of the gap between the stacked bodies are removed by etching.

Figure 14:
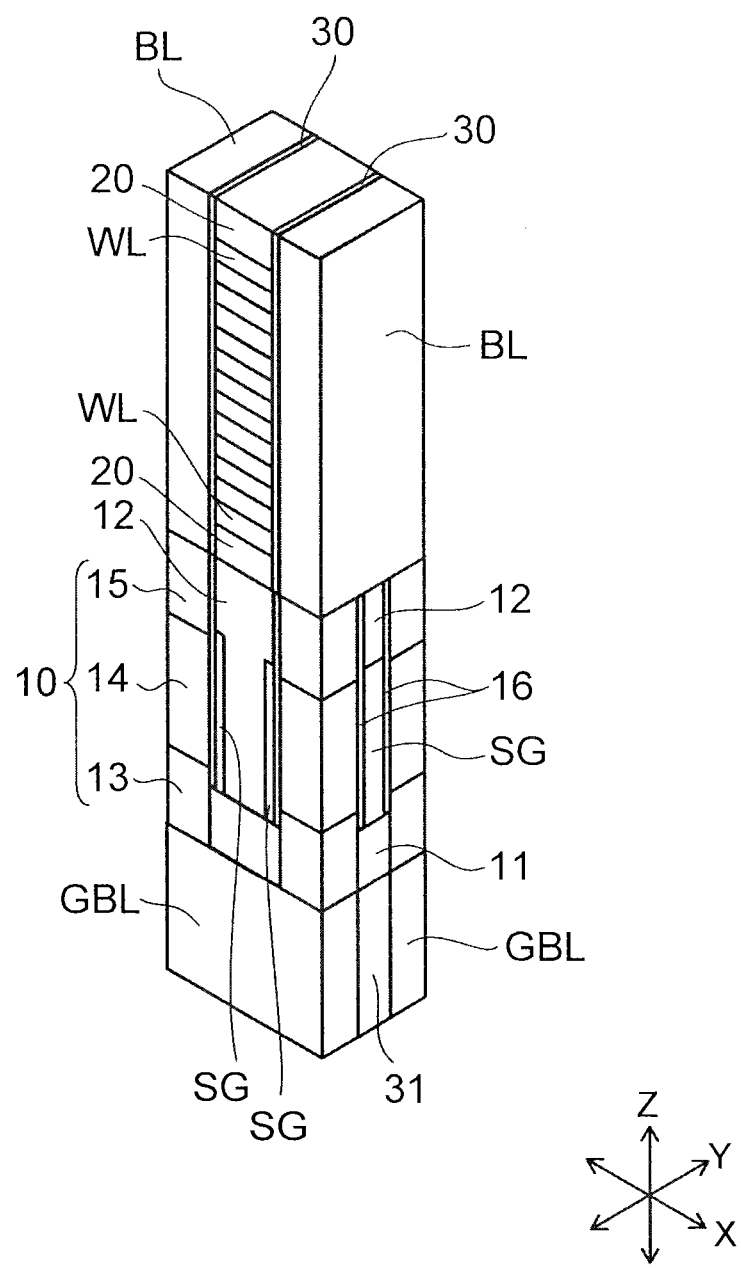

After forming the resistance change film 30, as shown in FIG. 14, polycrystalline silicon containing e.g. N-type dopant constituting the material of the bit line BL is embedded between the stacked bodies adjacent in the X-direction.

The polycrystalline silicon deposited on the stacked body is removed by CMP (chemical mechanical polishing) technique.

Subsequently, as shown in FIG. 15, the polycrystalline silicon is separated in the Y-direction by RIE technique. Furthermore, the resistance change film 30 can also be separated in the Y-direction.

Thus, a bit line BL shaped like e.g. a column is formed on each semiconductor layer 10. An insulating layer, not shown, is embedded between the bit lines BL adjacent in the Y-direction. A word line WL has been formed via the resistance change film 30 between the bit lines BL adjacent in the X-direction.

According to the embodiment, the word lines WL and the bit lines BL can be formed with a constant pitch in the X-direction and the Y-direction. The word line WL and the bit line BL can be formed so as to cross each other in a self-aligned manner in the Z-direction. Thus, the alignment accuracy in the memory cell array at the time of manufacturing can be made looser, and this facilitates manufacturing. Accordingly, the embodiment can provide a high integration semiconductor memory device at low cost.

Next, a method for forming the Y-direction end part of the gate electrode SG with a contact 40 formed thereon is described.

FIGS. 16A to 18B show a first specific example of the method for forming the end part of the gate electrode SG.

Figure 16A:
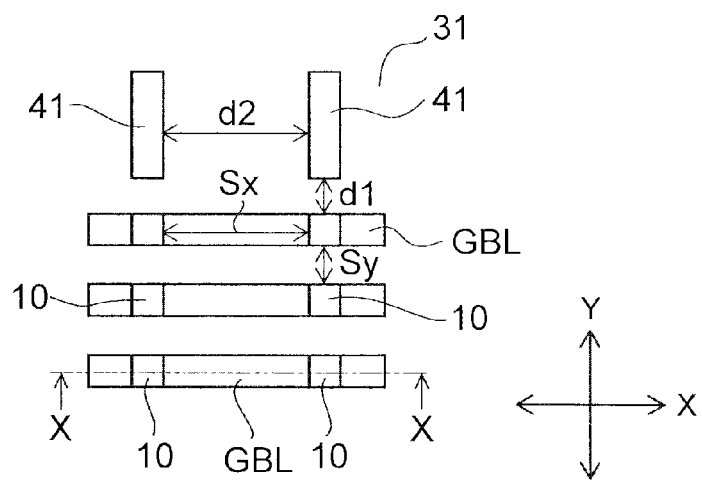
Figure 17A:
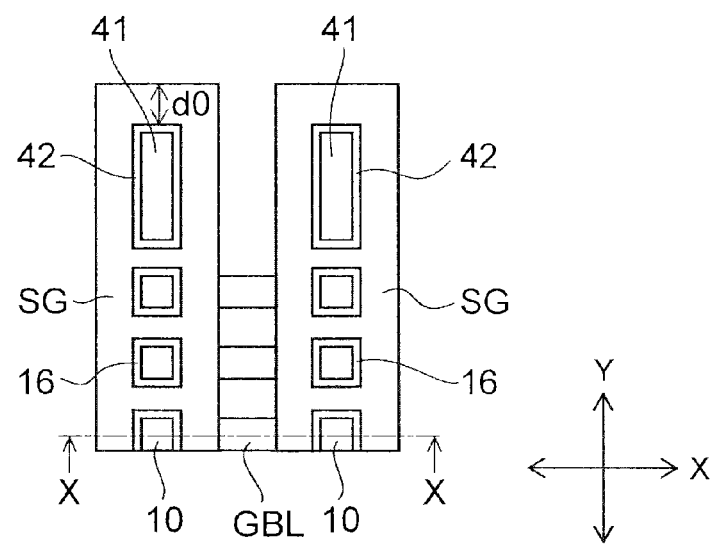
Figure 18A:
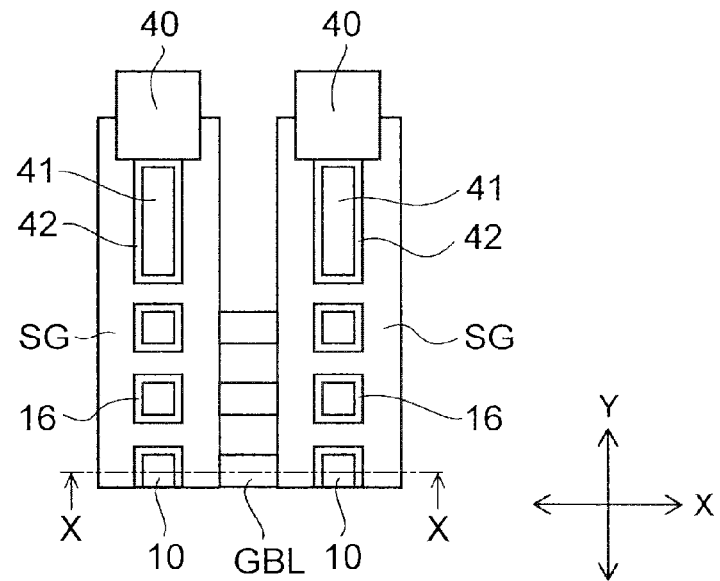

FIGS. 16A, 17A, and 18A are schematic plan views of the Y-direction end region of the memory cell array.

Figure 16B:
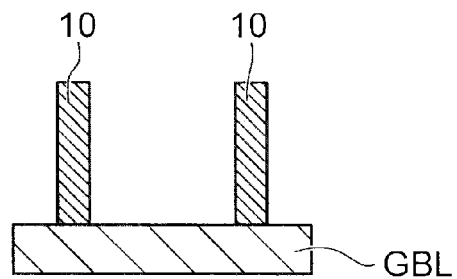
Figure 17B:
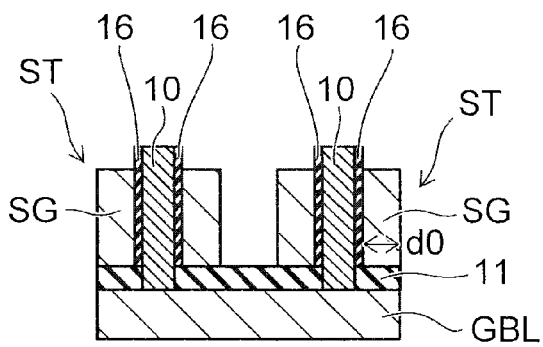
Figure 18B:
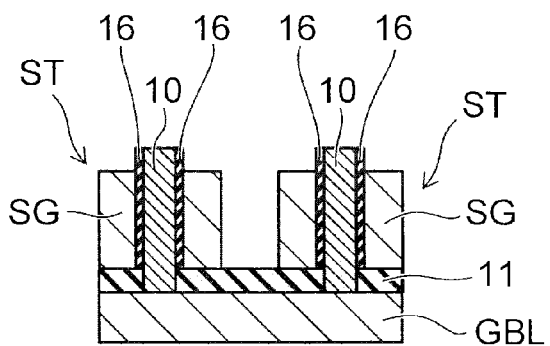

FIGS. 16B, 17B, and 18B are sectional views taken along line X-X in FIGS. 16A, 17A, and 18A, respectively.

FIGS. 16A and 16B correspond to the step shown in FIG. 8B described above.

An end pattern 41 is formed in the outside region at the end of the Y-direction arrangement of the plurality of semiconductor layers 10. The end pattern 41 is formed from the same material and processed at the same time as the semiconductor layers 10.

However, the global bit line GBL is not formed in the Y-direction end region. The end pattern 41 is formed like e.g. a column on the insulating layer. The end pattern 41 can be formed in a shape longer in the Y-direction than in the X-direction. The insulating layer below the end pattern 41 is the insulating layer formed simultaneously with the insulating layer 31 between the global bit lines GBL shown in FIG. 8B.

The X-direction width of the end pattern 41 is generally equal to the X-direction width of the semiconductor layer 10. The Y-direction width of the end pattern 41 is larger than the Y-direction width of the semiconductor layer 10.

The spacing d1 between the most marginal semiconductor layer 10 and the end pattern 41 is equal to or smaller than the Y-direction spacing Sy between the semiconductor layers 10 adjacent in the Y-direction.

Furthermore, the spacing d1 between the most marginal semiconductor layer 10 and the end pattern 41 is smaller than the X-direction spacing d2 between the end patterns 41 adjacent in the X-direction.

Next, as described above with reference to FIG. 9B, an insulating layer 11 is formed at the bottom of the gap between the semiconductor layers 10 and between the end patterns 41.

Subsequently, a gate insulating film 16 is formed on all the side surfaces of the semiconductor layer 10. At this time, as shown in FIG. 17A, an insulating film 42, which is the same as the gate insulating film 16, is formed also on all the side surfaces of the end pattern 41.

Next, a gate electrode SG is formed so as to surround all the side surfaces of the semiconductor layer 10 via the gate insulating film 16. As described above, the gate electrode SG is formed so as to fill the gap between the semiconductor layers 10 adjacent in the Y-direction and to produce a gap between the semiconductor layers 10 adjacent in the X-direction.

At this time, as shown in FIG. 17A, the gate electrode SG also surrounds all the side surfaces of the end pattern 41 via the insulating film 42.

The spacing d1 between the most marginal semiconductor layer 10 and the end pattern 41 is narrower than the sum of twice the film thickness of the gate insulating film and twice the film thickness of the gate electrode SG. Thus, the gate electrode SG fills the gap between the most marginal semiconductor layer 10 and the end pattern 41. Accordingly, the gate electrode SG surrounding the semiconductor layer 10 and the gate electrode SG surrounding the end pattern 41 are connected in the Y-direction.

The spacing d2 between the end patterns 41 adjacent in the X-direction is wider than the sum of twice the film thickness of the gate insulating film and twice the film thickness of the gate electrode SG. Thus, as in the region with the semiconductor layer 10 placed therein, the gate electrodes SG are separated in the X-direction also in the region with the end pattern 41 placed therein.

Then, a contact hole reaching the underlying control circuit is formed as shown in FIG. 18A. The contact hole penetrates through part of the gate electrode SG formed on the side surface of the end pattern 41. A conductive material is embedded in the contact hole. Thus, a contact 40 connecting the gate electrode SG to the control circuit is formed.

The global bit line GBL is not formed below the end pattern 41. Thus, the end pattern 41 is not connected to the global bit line GBL. Accordingly, the end patterns 41 adjacent in the X-direction are electrically separated. Thus, as shown in FIG. 4A, even if the contact 40 is in contact with the end pattern 41, the contacts 40 adjacent in the X-direction can be electrically separated. As a result, the alignment margin of the contact 40 and the gate electrode SG can be improved. The end pattern 41 and the contact 40 may be arranged as shown in FIG. 4A.

The end patterns 41 are formed with an appropriate spacing in the end region of the memory cell array. The gate electrode SG is formed also on the side surface of the end pattern 41 by the isotropic sidewall deposition process. Thus, a gate electrode SG separated in the X-direction can be formed by a simple process so as to extend continuously to the position where the contact 40 is formed.

FIGS. 19A to 22C show a second specific example of the method for forming the end part of the gate electrode SG.

FIGS. 19A, 20A, 21A, and 22A are schematic plan views of the Y-direction end region of the memory cell array.

FIGS. 19B, 20B, 21B, and 22B are sectional views taken along line X-X in FIGS. 19A, 20A, 21A, and 22A, respectively.

Figure 20A:
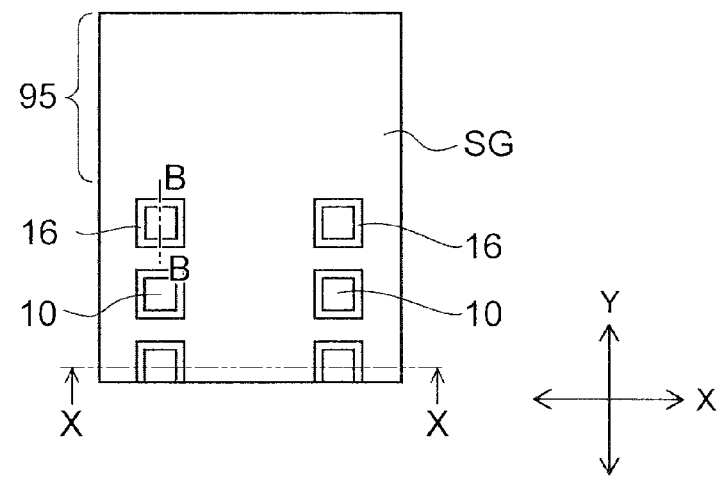
Figure 20B:
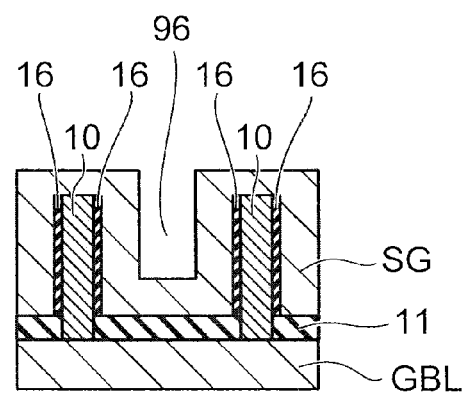
Figure 20C:
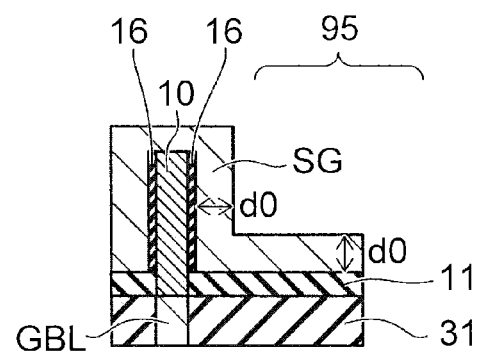
Figure 21A:
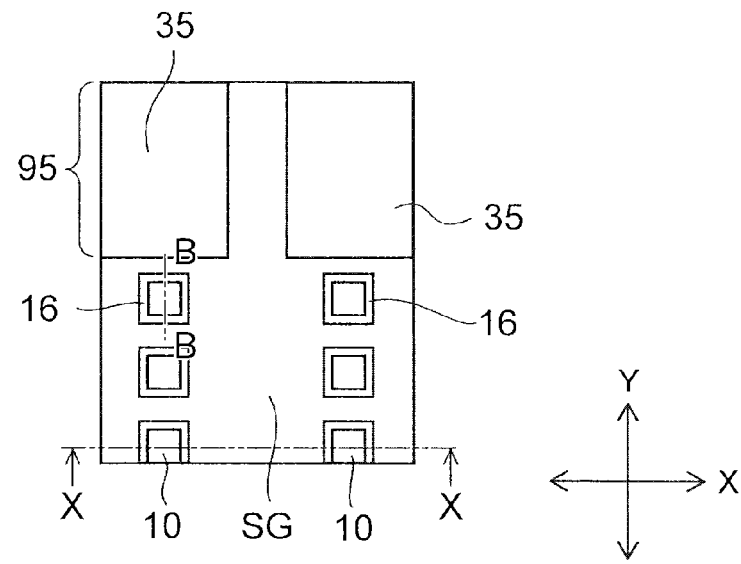
Figure 21B:
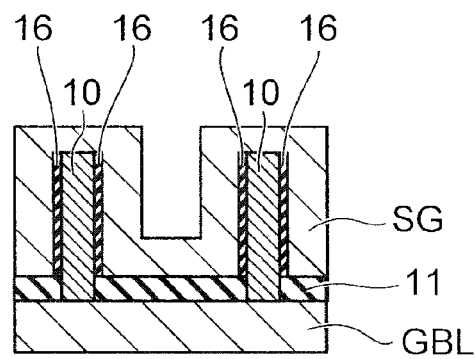
Figure 21C:
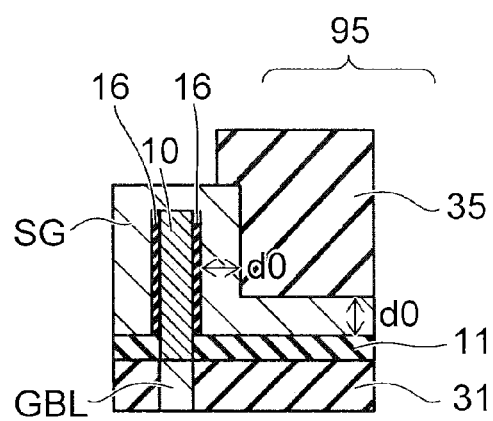
Figure 22A:
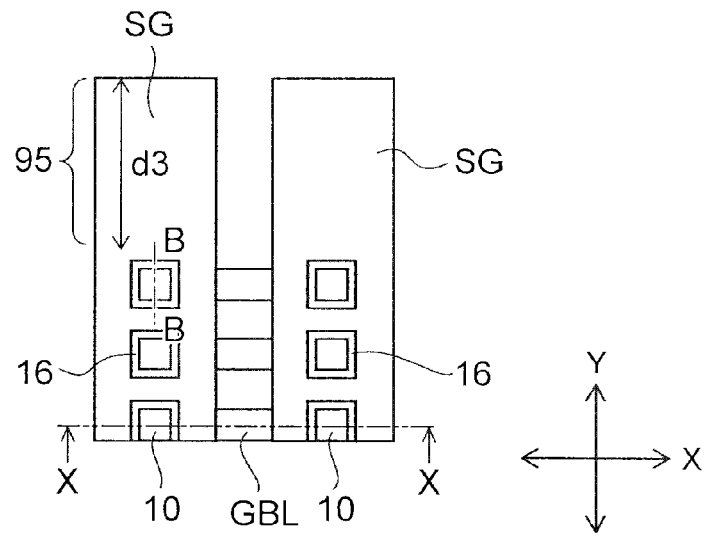
Figure 22B:
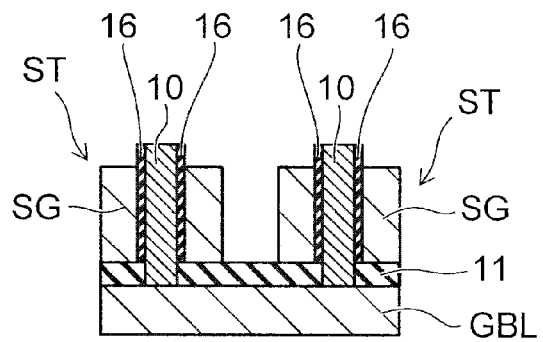
Figure 22C:
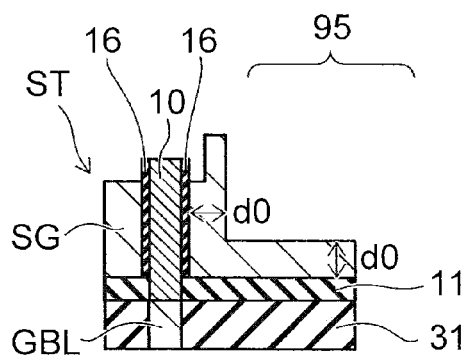

FIGS. 20C, 21C, and 22C are sectional views taken along line B-B in FIGS. 20A, 21A, and 22A, respectively.

Figure 19A:
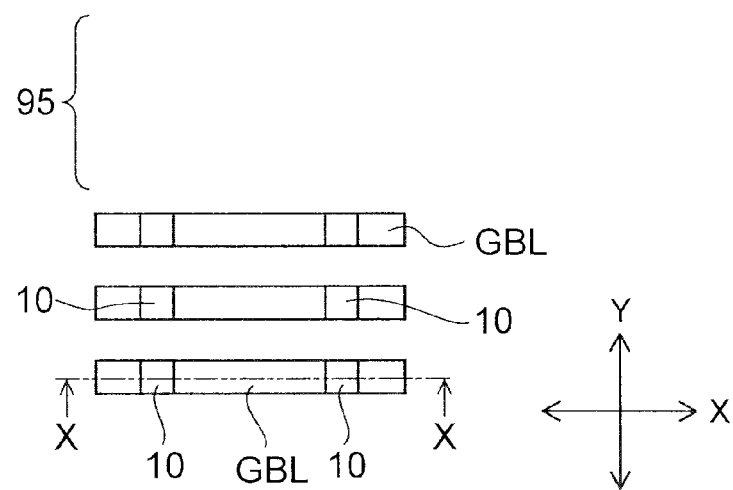
Figure 19B:
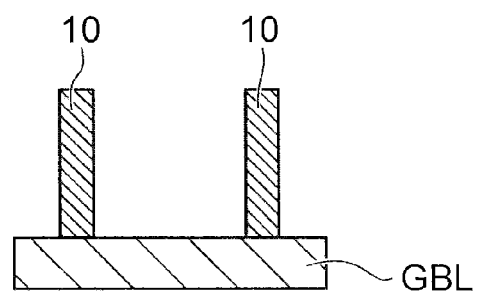

FIGS. 19A and 19B correspond to the step shown in FIG. 8B described above.

The global bit line GBL is not formed in the outside region 95 at the end of the Y-direction arrangement of the plurality of semiconductor layers 10.

Then, a gate insulating film 16 is formed on all the side surfaces of the semiconductor layer 10. Subsequently, as shown in FIGS. 20A and 20B, a gate electrode SG is deposited on the region with the plurality of semiconductor layers 10 arranged therein and on the outside region 95.

As in the above embodiment, the gate electrode SG fills the Y-direction gap between the semiconductor layers 10 adjacent in the Y-direction. However, the gate electrode SG only conformally covers the bottom of the X-direction gap between the semiconductor layers 10 adjacent in the X-direction. Thus, a gap 96 is left between the semiconductor layers 10 adjacent in the X-direction. Furthermore, as shown in FIG. 20C, in the outside region 95, the gate electrode SG is formed with film thickness d0 on the insulating layer 11.

Next, as shown in FIG. 21A, a mask 35 is selectively formed on the gate electrode SG in the outside region 95. The mask 35 is formed so as to overlap at least part of the region in which the contact 40 is to be formed. Furthermore, the mask 35 is formed so as to include part of the gate electrode SG formed on the side surface of the semiconductor layer 10.

Next, as shown in FIGS. 22A and 22B, the gate electrode SG is etched back. Subsequently, the mask 35 is removed. Thus, the gate electrode SG is separated in the X-direction in the region with the plurality of semiconductor layers 10 arranged therein and the outside region 95. Furthermore, the gate electrode SG formed on the side surface of the semiconductor layer 10 is shaped like being extracted to the outside region 95 in the Y-direction. The length d3 of the gate electrode SG extracted to the outside region 95 in the Y-direction is larger than the film thickness d0 of the gate electrode SG.

Then, a contact hole reaching the underlying control circuit is formed. The contact hole penetrates through, or exposes the upper surface and the side surface of, part of the end part of the gate electrode SG formed in the outside region 95. A conductive material is embedded in the contact hole. Thus, a contact 40 connecting the gate electrode SG to the control circuit is formed.

In the second example, the length of the gate electrode SG extracted to the outside region 95 can be made larger than the film thickness of the gate electrode SG. As a result, the contact area between the gate electrode SG and the contact 40 can be increased. Furthermore, the alignment margin of the gate electrode SG and the contact 40 can be increased.

FIGS. 23A to 26B show a third specific example of the method for forming the end part of the gate electrode SG.

FIGS. 23A, 24A, 25A, and 26A are schematic plan views of the Y-direction end region of the memory cell array.

FIGS. 23B, 24B, 25B, and 26B are sectional views taken along line X-X in FIGS. 23A, 24A, 25A, and 26A, respectively.

Figure 23A:
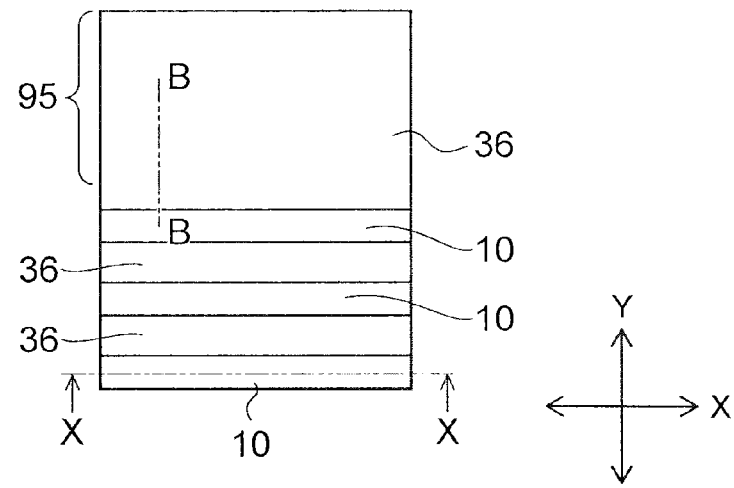
Figure 23B:
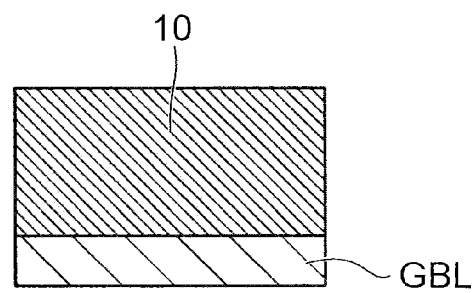
Figure 23C:
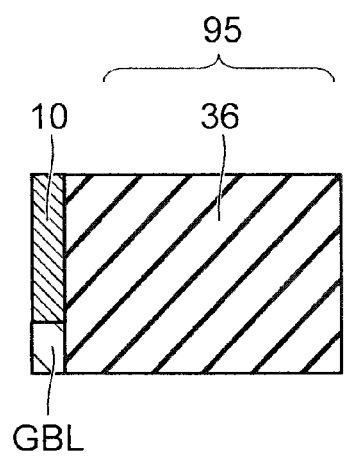
Figure 24A:
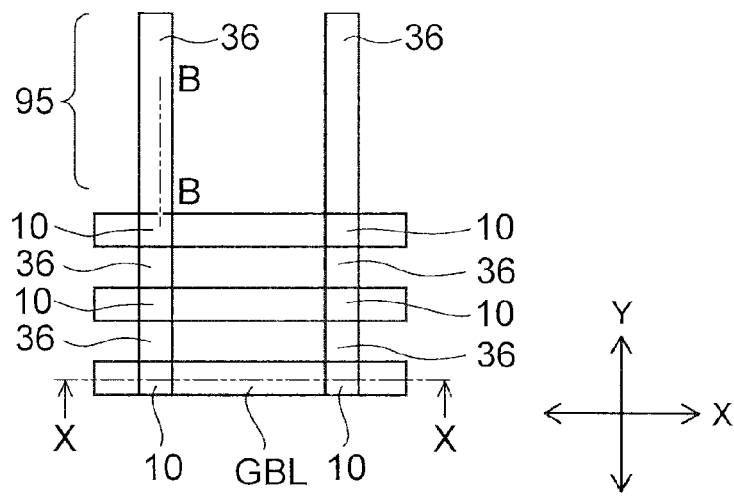
Figure 24B:
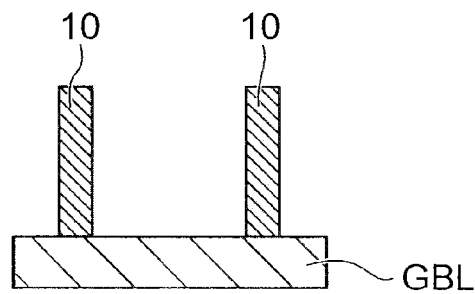
Figure 24C:
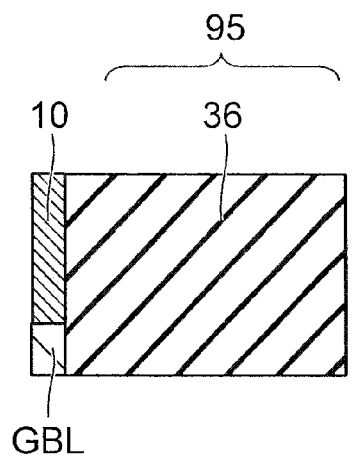
Figure 25A:
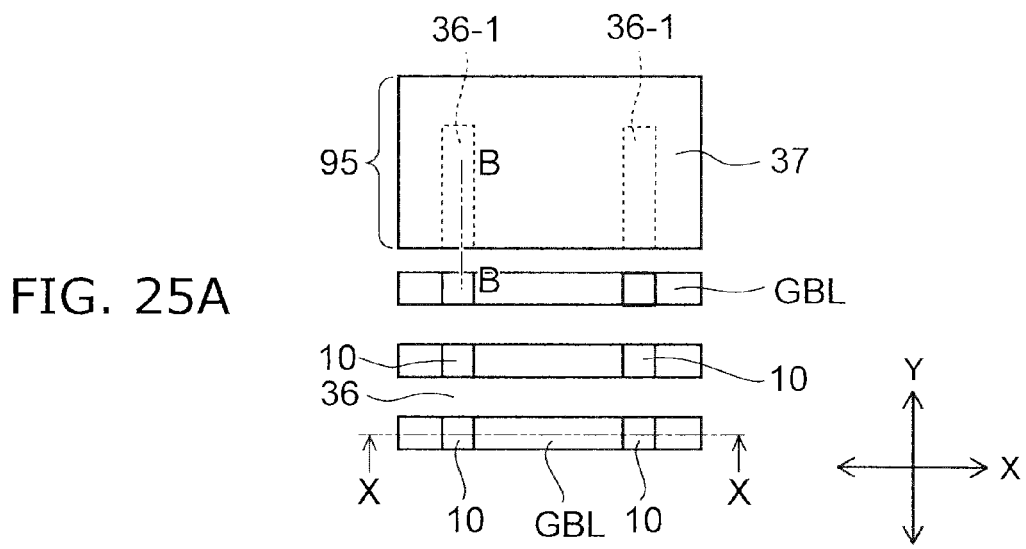
Figure 25B:
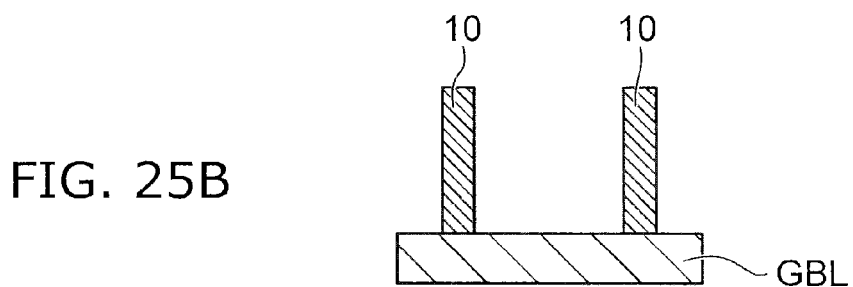
Figure 25C:
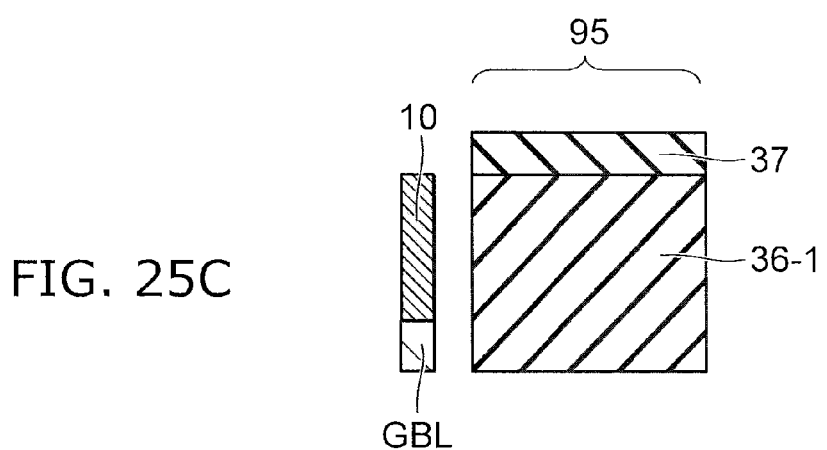

FIGS. 23C, 24C, and 25C are sectional views taken along line B-B in FIGS. 23A, 24A, and 25A, respectively.

According to the third specific example, a semiconductor layer 10 is formed on the global bit line GBL not separated in the Y-direction. Then, the semiconductor layer 10 and the global bit line GBL are processed in a line-and-space pattern extending in the X-direction and separated in the Y-direction. At this time, the global bit line GBL formed in the outside region 95 is removed. As shown in FIG. 23A, an insulating film 36 is embedded in the space of the line-and-space pattern.

Simultaneously, the insulating film 36 is embedded also in the outside region 95 at the end of the Y-direction arrangement of the plurality of semiconductor layers 10. The global bit line GBL is not formed in the outside region 95. Subsequently, the insulating film 36 is etched back. Thus, the upper surface of the insulating film 36 is made nearly flush with the upper surface of the semiconductor layer 10.

Then, the semiconductor layer 10 and the insulating film 36 are collectively processed using lithography technique and the like. Thus, as shown in FIG. 24A, the semiconductor layer 10 and the insulating film 36 are separated in the X-direction.

As a result, the semiconductor layer 10 is left in a generally columnar shape on the global bit line GBL. The insulating film 36 is left in a generally columnar shape extending in the Y-direction between the semiconductor layers 10 adjacent in the Y-direction and from the semiconductor layer 10 at the Y-direction end to the outside region 95.

Next, as shown in FIG. 25A, a mask 37 is formed so as to cover the insulating film 36 in the outside region 95. The insulating film 36 between the semiconductor layers 10 is removed by etching. As a result, the insulating film 36 between the semiconductor layers 10 adjacent in the Y-direction is removed. The spacing between the mask 37 and the semiconductor layer 10 at the Y-direction end is made smaller than the sum of twice the film thickness of the gate insulating film and twice the film thickness of the gate electrode SG. As a result, an insulating film 36-1 spaced from the semiconductor layer 10 at the Y-direction end is formed in the outside region 95. The insulating film 36-1 extends in the Y-direction.

Figure 9A:
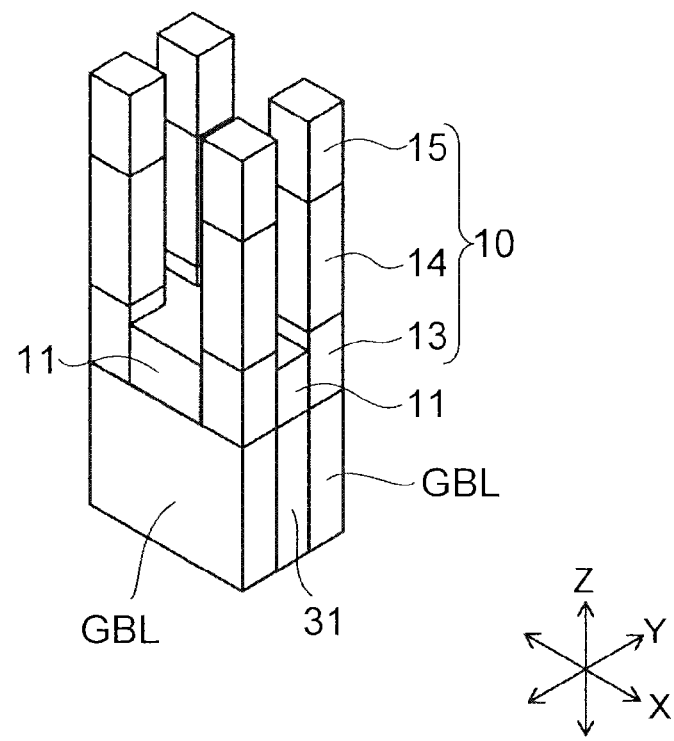
Figure 9B:
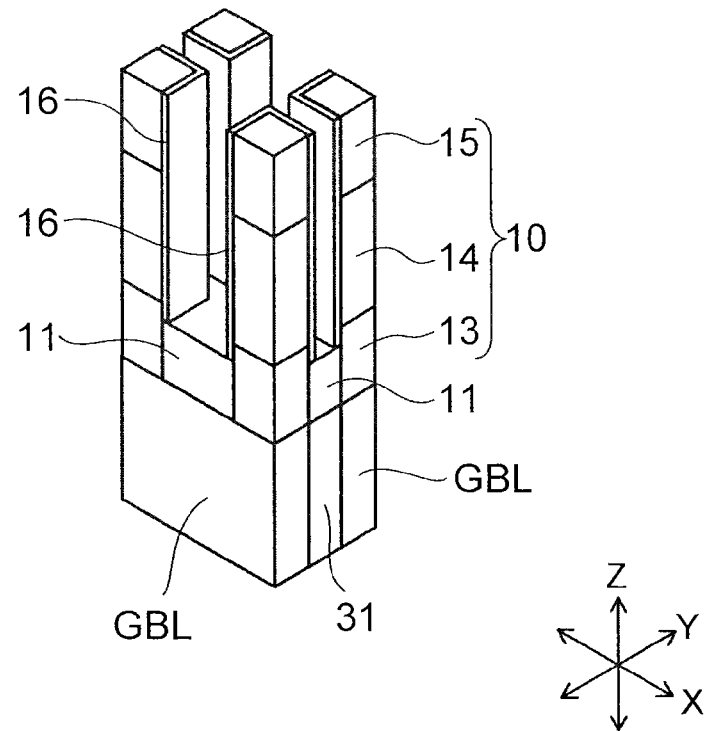

Next, after forming an insulating layer 11 as in FIG. 9A, a gate insulating film 16 is formed on all the side surfaces of the semiconductor layer 10. At this time, as shown in FIG. 26A, an insulating film 42, which is the same as the gate insulating film 16, is formed also on all the side surfaces of the insulating film 36-1 left in the outside region 95.

Next, a gate electrode SG is formed so as to surround all the side surfaces of the semiconductor layer 10 via the gate insulating film 16. As described above, the gate electrode SG is formed so as to fill the gap between the semiconductor layers 10 adjacent in the Y-direction and to produce a gap between the semiconductor layers 10 adjacent in the X-direction.

Figure 26A:
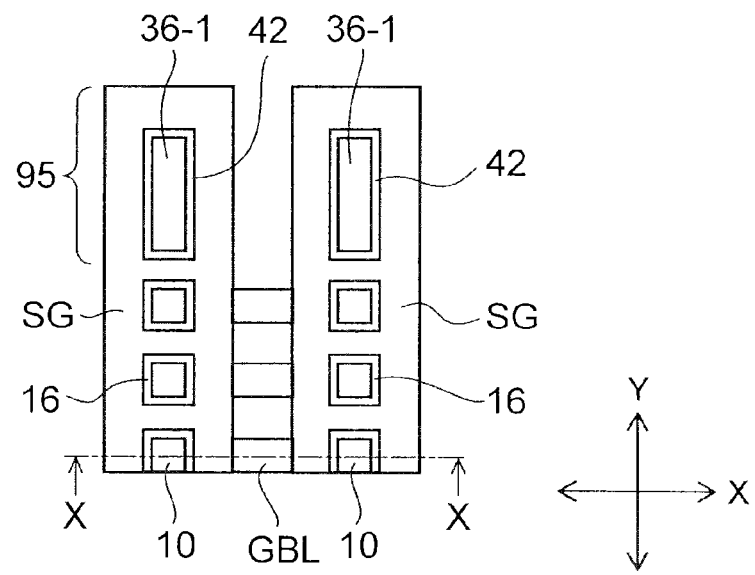
Figure 26B:
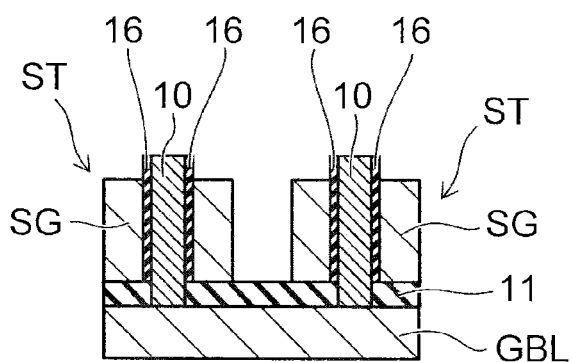

At this time, as shown in FIG. 26A, the gate electrode SG also surrounds all the side surfaces of the insulating film 36-1 via the insulating film 42.

The spacing between the most marginal semiconductor layer 10 and the insulating film 36-1 is narrower than the sum of twice the film thickness of the gate insulating film and twice the film thickness of the gate electrode SG. Thus, the gate electrode SG fills the gap between the most marginal semiconductor layer 10 and the insulating film 36-1. Accordingly, the gate electrode SG surrounding the semiconductor layer 10 and the gate electrode SG surrounding the insulating film 36-1 are connected in the Y-direction.

The gate electrode SG does not fill the gap between the insulating films 36-1 adjacent in the X-direction. Thus, as in the region with the semiconductor layer 10 placed therein, the gate electrodes SG are separated in the X-direction also in the region with the insulating film 36-1 placed therein.

Then, a contact hole reaching the underlying control circuit is formed. The contact hole penetrates through part of the gate electrode SG formed on the side surface of the insulating film 36-1. A conductive material is embedded in the contact hole. Thus, a contact 40 connecting the gate electrode SG to the control circuit is formed. Here, the insulating film 36-1 may be in contact with the contact 40. As a result, the alignment margin of the gate electrode SG and the contact 40 can be increased.

FIGS. 27A to 29B show a fourth specific example of the method for forming the end part of the gate electrode SG.

Figure 27A:
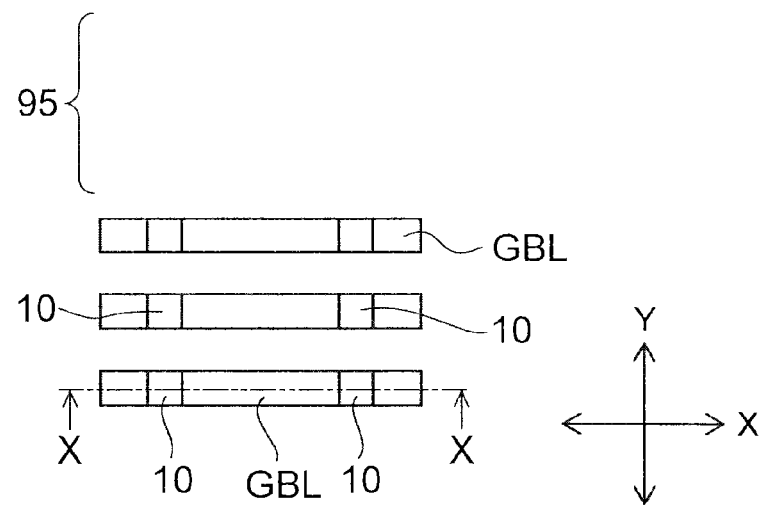
Figure 28A:
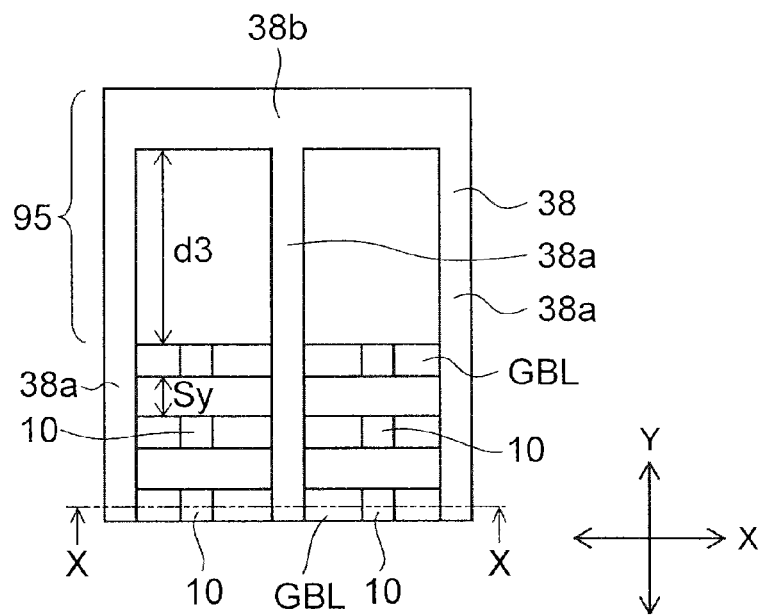
Figure 29A:
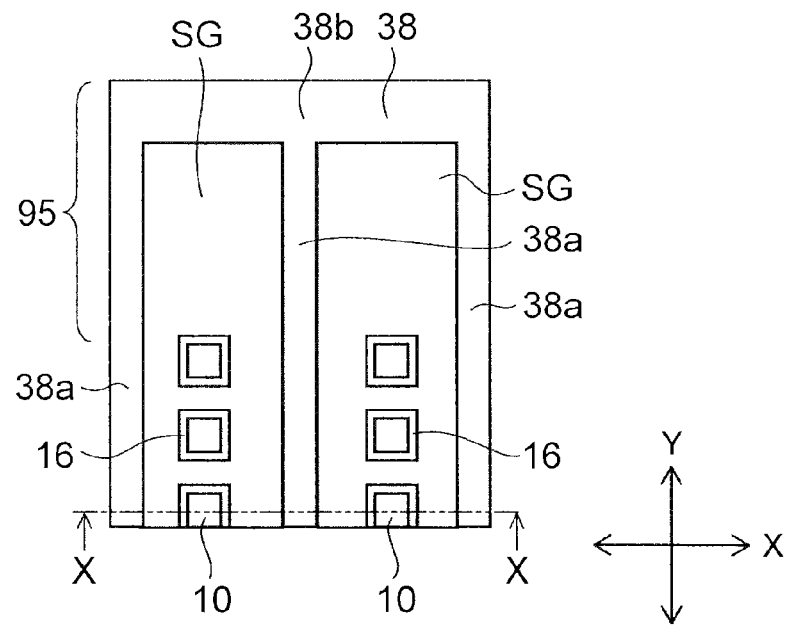

FIGS. 27A, 28A, and 29A are schematic plan views of the Y-direction end region of the memory cell array.

Figure 27B:
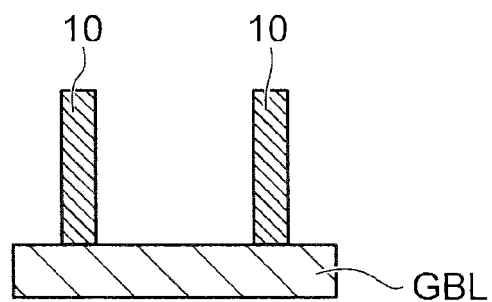
Figure 28B:
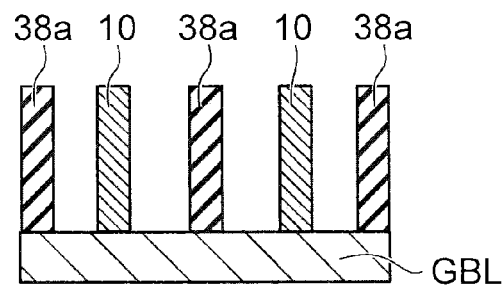
Figure 29B:
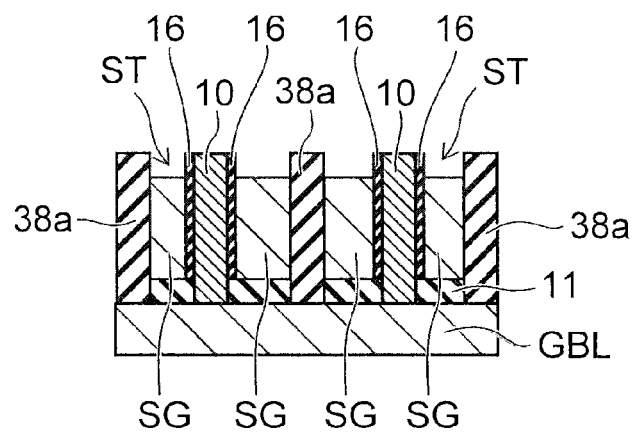

FIGS. 27B, 28B, and 29B are sectional views taken along line X-X in FIGS. 27A, 28A, and 29A, respectively.

FIGS. 27A and 27B correspond to the step shown in FIG. 8B described above.

The global bit line GBL is not formed in the outside region 95 at the end of the Y-direction arrangement of the plurality of semiconductor layers 10.

Then, an insulating film 38 is formed on the entire surface of the region with the plurality of semiconductor layers 10 arranged therein and the outside region 95. Subsequently, the insulating film 38 is etched back. Thus, the upper surface of the insulating film 38 is made nearly flush with the upper surface of the semiconductor layer 10. Next, as shown in FIG. 28A, the insulating film 38 is patterned.

The insulating film 38 includes a plurality of first line parts 38a arranged with spacings in the X-direction and extending in the Y-direction. Furthermore, the insulating film 38 includes a second line part 38b formed in the outside region 95 and extending in the X-direction. The end parts of the plurality of first line parts 38a are connected to the second line part 38b.

The second line part 38b is spaced by distance d3 from the semiconductor layer 10 most marginal in the Y-direction. This distance d3 is larger than the Y-direction spacing Sy between the semiconductor layers 10. The first line part 38a extends in the Y-direction between the semiconductor layers 10 adjacent in the X-direction.

The region with the plurality of semiconductor layers 10 arranged therein and the outside region 95 are partitioned into a plurality of rectangular (slit-shaped) regions extending in the Y-direction by the first line parts 38a and the second line part 38b of the insulating film 38.

Next, an insulating layer 11 is formed as in FIG. 9A. Then, a gate insulating film 16 is formed on all the side surfaces of the semiconductor layer 10. Subsequently, as shown in FIG. 29A, a gate electrode SG is embedded in the plurality of rectangular (slit-shaped) regions surrounded with the insulating film 38.

Thus, a gate electrode SG is formed. The gate electrode SG is separated in the X-direction in the region with the plurality of semiconductor layers 10 arranged therein and the outside region 95. Furthermore, the gate electrode SG extends continuously in the Y-direction in the region with the plurality of semiconductor layers 10 arranged therein and the outside region 95.

Then, a contact hole reaching the underlying control circuit is formed. The contact hole penetrates through part of the end part of the gate electrode SG formed in the outside region 95. A conductive material is embedded in the contact hole. Thus, a contact 40 connecting the gate electrode SG to the control circuit is formed.

Figure 30A:
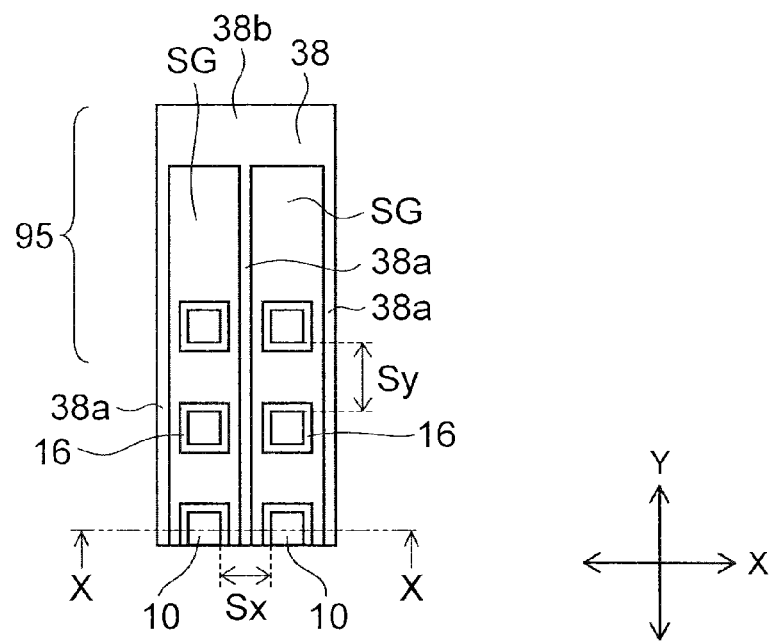
Figure 30B:
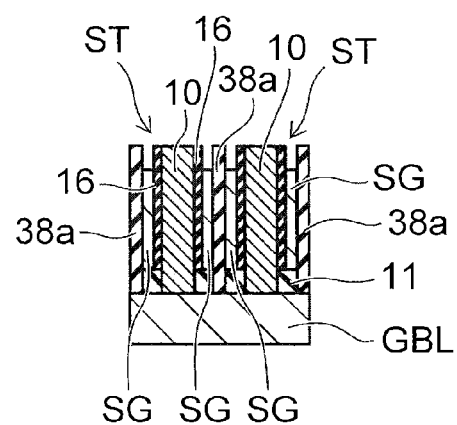

In the case of this fourth specific example, as shown in FIGS. 30A and 30B, the X-direction spacing Sx between the plurality of semiconductor layers 10 can be made smaller than or equal to the Y-direction spacing Sy. FIGS. 30A and 30B correspond to FIGS. 29A and 29B, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
  a plurality of global bit lines extending in a first direction and arranged with spacings in a second direction crossing the first direction;
  a plurality of word lines spaced in the first direction, extending in the second direction, and stacked via an interlayer insulating layer in a third direction crossing the first direction and the second direction, the word lines including a first word line and a second word line arranged adjacently to each other in the first direction;
  a plurality of bit lines arranged with spacings in the second direction between the word lines, and extending in the third direction, the bit lines including a first bit line and a second bit line arranged adjacently to each other in the first direction, the first bit line provided between the first word line and the second word line, the first word line provided between the first bit line and the second bit line;
  a plurality of resistance change films provided between the word lines and the bit lines, the resistance change films including a first resistance change film and a second resistance change film arranged adjacently to each other in the first direction, the first word line provided between the first bit line via the first resistance change film and the second bit line via the second resistance change film;
  a plurality of semiconductor layers provided between the global bit lines and the bit lines;
  a gate insulating film provided on a side surface of the semiconductor layers; and
  a plurality of gate electrodes provided via the gate insulating film between the semiconductor layers in the second direction and on the side surface of the semiconductor layers in the first direction, and extending in the second direction,
  spacing in the first direction between the plurality of semiconductor layers being larger than spacing in the second direction between the plurality of semiconductor layers,
  the plurality of gate electrodes being separated in the first direction, and
  in the first direction, a distance between the gate electrodes adjacently arranged being shorter than a distance between the first bit line and the second bit line.

2. The device according to claim 1, wherein pitch in the first direction of the plurality of semiconductor layers adjacently arranged is larger than pitch in the second direction of the plurality of semiconductor layers adjacently arranged.

3. The device according to claim 1, wherein a contact is provided in an end part in the second direction of the gate electrodes, and the contact extends further downward than the gate electrodes in the third direction.

4. The device according to claim 3, wherein the global bit lines are not provided below the end part in the second direction of the gate electrode.

5. The device according to claim 3, wherein the gate electrodes have first end parts and second end parts opposite to the first end parts in the second direction, the gate electrodes include a first gate electrode and a second gate electrode arranged adjacently to each other in the first direction, the contact includes a first contact and a second contact, the first contact is in contact with a first end part of the first gate electrode, and the second contact is in contact with a second end part of the second gate electrode.

6. The device according to claim 5, wherein the first end part of the first gate electrode is projected further in the second direction than a first end part of the second gate electrode not provided with the contact.

7. The device according to claim 1, wherein
  the semiconductor layers are shaped like a column, and
  the gate insulating film is provided on a first side surface facing the first direction and a second side surface facing the second direction of the semiconductor layers.

8. The device according to claim 1, wherein the spacing between the semiconductor layers in the second direction is smaller than sum of twice film thickness of the gate insulating film and twice film thickness of the gate electrodes.

9. The device according to claim 1, wherein the spacing between the semiconductor layers in the first direction is larger than sum of twice film thickness of the gate insulating film and twice film thickness of the gate electrodes.

10. The device according to claim 1, wherein the gate electrodes are extracted longer than a film thickness of the gate electrodes in the second direction.

11. The device according to claim 1, further comprising:
  an end pattern adjacent to a first semiconductor layer in the second direction, the end pattern placed at an end in the second direction of the plurality of semiconductor layers, wherein a part of the gate electrodes is placed between the end pattern and the first semiconductor layer.

12. The device according to claim 11, further comprising:
an insulating film provided on a side surface of the end pattern,
wherein distance between the end pattern and the first semiconductor layer is smaller than sum of twice film thickness of the gate insulating film and twice film thickness of the gate electrodes.

13. The device according to claim 11, further comprising:
an insulating film provided on a side surface of the end pattern,
wherein the insulating film is made of same material as the gate insulating film, and
the part of the gate electrodes is provided on the side surface of the end pattern via the insulating film.

14. The device according to claim 11, wherein the end pattern extends in the second direction.

15. The device according to claim 11, wherein a contact is in contact with the end pattern.

* * * * *